United States Patent
Kim et al.

(10) Patent No.: US 11,990,425 B2
(45) Date of Patent: May 21, 2024

(54) STRESS RELIEF IN SEMICONDUCTOR WAFERS

(71) Applicant: Tokyo Electron Limited, Tokyo (JP)

(72) Inventors: Hojin Kim, Albany, NY (US); Stephen Mancini, East Greenbush, NY (US); Soo Doo Chae, Cohoes, NY (US)

(73) Assignee: Tokyo Electron Limited, Tokyo (JP)

( * ) Notice: Subject to any disclaimer, the term of this patent is extended or adjusted under 35 U.S.C. 154(b) by 269 days.

(21) Appl. No.: 17/405,265

(22) Filed: Aug. 18, 2021

(65) Prior Publication Data

US 2022/0102289 A1 Mar. 31, 2022

Related U.S. Application Data

(60) Provisional application No. 63/085,554, filed on Sep. 30, 2020.

(51) Int. Cl.
*H01L 21/762* (2006.01)
*H01L 21/311* (2006.01)
*H01L 21/66* (2006.01)
*H01L 23/00* (2006.01)

(52) U.S. Cl.
CPC ...... *H01L 23/562* (2013.01); *H01L 21/31144* (2013.01); *H01L 21/76224* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 5,851,929 A | 12/1998 | Thakur et al. | |
| 2001/0055689 A1* | 12/2001 | Park | C30B 15/206 257/E21.321 |
| 2008/0093708 A1* | 4/2008 | Noma | H01L 24/13 257/E21.599 |
| 2015/0294917 A1 | 10/2015 | deVilliers | |
| 2017/0162522 A1 | 6/2017 | Chang et al. | |
| 2020/0100358 A1* | 3/2020 | Tuominen | H05K 3/4697 |
| 2020/0194558 A1* | 6/2020 | Brockmeier | H01L 29/1608 |

FOREIGN PATENT DOCUMENTS

CN 110993495 A * 4/2020 ......... H01L 21/3043

OTHER PUBLICATIONS

CN110993495_English translation (Year: 2020).*
CN110993495_Englidh abstract (Year: 2020).*
(Continued)

*Primary Examiner* — Bo B Jang
(74) *Attorney, Agent, or Firm* — Slater Matsil, LLP

(57) ABSTRACT

This disclosure describes a method for fabricating a plurality of semiconductor devices in a semiconductor wafer includes: bowing a semiconductor wafer including a substrate by covering the substrate with a strained layer; forming trenches at locations in scribe lines of the semiconductor wafer, the scribe lines identifying areas between adjacent dies on the semiconductor wafer; and reducing the bowing of the semiconductor wafer by filling the trenches with a stress-compensation material.

20 Claims, 23 Drawing Sheets

(56) References Cited

OTHER PUBLICATIONS

Dreyer, Christian et al., "Synthesis, Processing and Characterization of New High-Performance Polymers For Use in Integrated Optics," Polytronic, Montreux, Switzerland, Oct. 21-23, 2003, 6 pages.
Tilli, Markku et al., "Silicon Wafer and Thin Film Measurements," Micro and Nano Technologies, Handbook of Silicon Based MEMS Materials and Technologies (Second Edition), Chapter 15.2, https://www.sciencedirect.com/topics/engineering/wafer-flatness, 2015, 4 pages.

* cited by examiner

STRESS RELIEF IN SEMICONDUCTOR WAFERS

CROSS-REFERENCE TO RELATED APPLICATIONS

This application claims the benefit of U.S. Provisional Application No. 63/085,554, filed on Sep. 30, 2020, which application is hereby incorporated herein by reference.

TECHNICAL FIELD

The present invention relates generally to a method for semiconductor device fabrication, and, in particular embodiments, to stress relief in semiconductor wafers.

BACKGROUND

Generally, a semiconductor device, such as an integrated circuit (IC) is fabricated by sequentially depositing and patterning layers of dielectric, metal, and semiconductor materials over a substrate to form a network of electronic components (e.g., transistors, resistors, and capacitors) connected by metal lines, contacts, and vias integrated in a monolithic structure. At each successive technology node, the feature sizes are shrunk, roughly doubling the component packing density to reduce cost and increase functionality. The high areal density in an advanced IC design is achieved by innovations that enable printing nanoscale features and fabricating three-dimensional (3D) device architectures to reduce device footprint. Fabricating 3D devices such as the gate-all-around field-effect transistor (GAAFET) and 3D NAND memory may involve depositing and patterning a relatively thick stacked layer comprising a plurality of layers. The formation process may induce mechanical strain in the stacked layer that exerts stresses of sufficient magnitude to bend an initially flat semiconductor wafer. With lateral dimensions approaching the molecular scale, wafer bowing has to be strictly contained to achieve the fine mask alignment and feature size control needed during patterning. Accordingly, further innovations in methods for relieving process-induced stress and controlling wafer deformation may have to be made for continued scaling in semiconductor IC manufacturing.

SUMMARY

This disclosure describes a method for fabricating a plurality of semiconductor devices in a semiconductor wafer that includes: bowing a semiconductor wafer including a substrate by covering the substrate with a strained layer; forming trenches at locations in scribe lines of the semiconductor wafer, the scribe lines identifying areas between adjacent dies on the semiconductor wafer; and reducing the bowing of the semiconductor wafer by filling the trenches with a stress-compensation material.

This disclosure also describes a method for fabricating a plurality of semiconductor devices in a semiconductor wafer that includes: bowing a semiconductor wafer including a substrate by covering the substrate with a strained layer and hard mask layer; forming trenches in the hard mask layer at locations in scribe lines of the semiconductor wafer, the scribe lines identifying areas between adjacent dies on the semiconductor wafer; and reducing the bowing of the semiconductor wafer by overfilling the trenches with a stress-compensation material and removing an excess portion of the stress-compensation material overfilling the trenches.

A method for reducing bowing in a semiconductor wafer is described including: designing a photomask, where designing the photomask includes: obtaining a predetermined bowing of a semiconductor wafer and based thereon obtaining a predetermined volume of a stress-compensation material; obtaining a predetermined depth of trenches to be formed in scribe lines of the semiconductor wafer; determining a pattern of trenches based on the predetermined depth of the trenches and the predetermined volume of the stress-compensation material, where the trenches are placed at locations in an area of the photomask for the scribe lines of the semiconductor wafer; forming a photomask with the determined pattern of trenches based on the designed photomask; processing a semiconductor wafer, the processing forming a strained layer covering a substrate, where the wafer is bowed after forming the strained layer; forming trenches at locations in the scribe lines using photolithography with the designed photomask, the trenches having a depth dimension; and filling the trenches with the stress-compensation material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
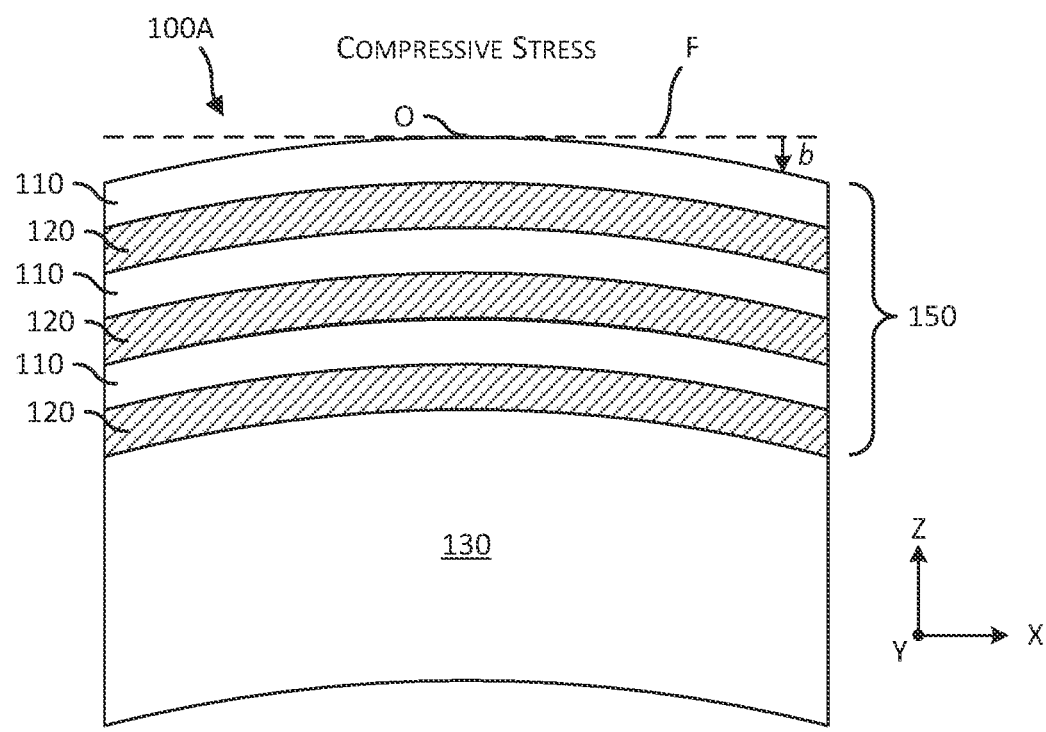
FIGS. 1A and 1B are cross-sectional views of semiconductor wafers illustrating wafer bowing generated during an intermediate stage of processing, in accordance to some embodiments.

The present disclosure relates to reducing bowing of semiconductor wafers by compensating the mechanical stress in the bowed wafer. Embodiments of the invention, described in this disclosure, provide methods for reducing wafer bowing generated during an intermediate stage of fabrication. Generally, a highly planar semiconductor wafer is conducive to semiconductor processing such as photolithography. For example, a pattern on a photomask is often transferred to a photoresist layer coated over a semiconductor wafer by illuminating a region of the photomask and projecting its image onto the photoresist while scanning the photomask and the wafer to span an exposure field. Wafer bow across a top major surface of the semiconductor wafer causes the vertical location of the illuminated spot on the photoresist to deviate continuously from the image plane of the projection system. This creates difficulty for the scanner to maintain the image in focus while the radiation beam modulated by the photomask pattern scans across the exposure field. Reducing wafer bowing helps avoid such complications, thereby improving pattern fidelity, processing uniformity, and manufacturing yield. In order to achieve a high fidelity pattern transfer in printing features having critical dimensions approaching 10 nanometers with edge placement errors less than about one nanometer, the tolerance for wafer bow may be no more than a height deviation of about 10 microns across a 300 mm diameter semiconductor wafer.

Semiconductor devices are generally fabricated by repeatedly depositing and patterning various layers on a semiconductor substrate using photolithography techniques. At an intermediate stage of some fabrication process flow, the layer covering the semiconductor substrate may be sufficiently strained to generate wafer bow caused by mechanical stress in the strained layer and the semiconductor substrate. If the bow is unacceptably large then, prior to photolithography, additional processing may be performed to reduce wafer bowing using, for example, methods described in this disclosure.

A layer may be strained due to various reasons, such as thermal cycling, material composition, and lattice mismatch at an interface. In one example, the deposited layer and the substrate may be unstrained at an elevated temperature at which the deposition process is performed but, upon cooling, the layer may be strained because of a difference in the coefficients of thermal expansion (CTE) between the semiconductor substrate and the deposited layer adhering to the substrate. In another example, an unequal size of atoms in a crystalline semiconductor alloy induces lattice strain, such as silicon-germanium alloy or silicon-carbon alloy formed embedded in crystalline silicon. In some other example, lattice mismatch between two contiguous crystalline layers such as a thin epitaxially grown layer (e.g., silicon) over a different crystalline material (e.g., germanium) may induce strain close to the interface between the two crystalline layers.

The strained layer may comprise a homogeneous material, a material with a graded composition, or a stack of heterogeneous materials. Stacked layers comprising alternating layers of a first material and a second material are often formed over a semiconductor substrate and patterned to fabricate electronic components using a 3D architecture that helps reduce the component footprint to increase component packing density. For example, fabricating the GAAFET may include forming a stacked layer comprising alternating nanosheets of silicon and silicon-germanium alloy, and fabricating the 3D NAND memory may include forming a stacked layer comprising alternating layers of silicon oxide and silicon nitride over a silicon substrate. If stress induced by the combined strain in the stack is of sufficiently large magnitude then the stacked layer adhering to the substrate may be bowing the wafer.

Figure 1B:
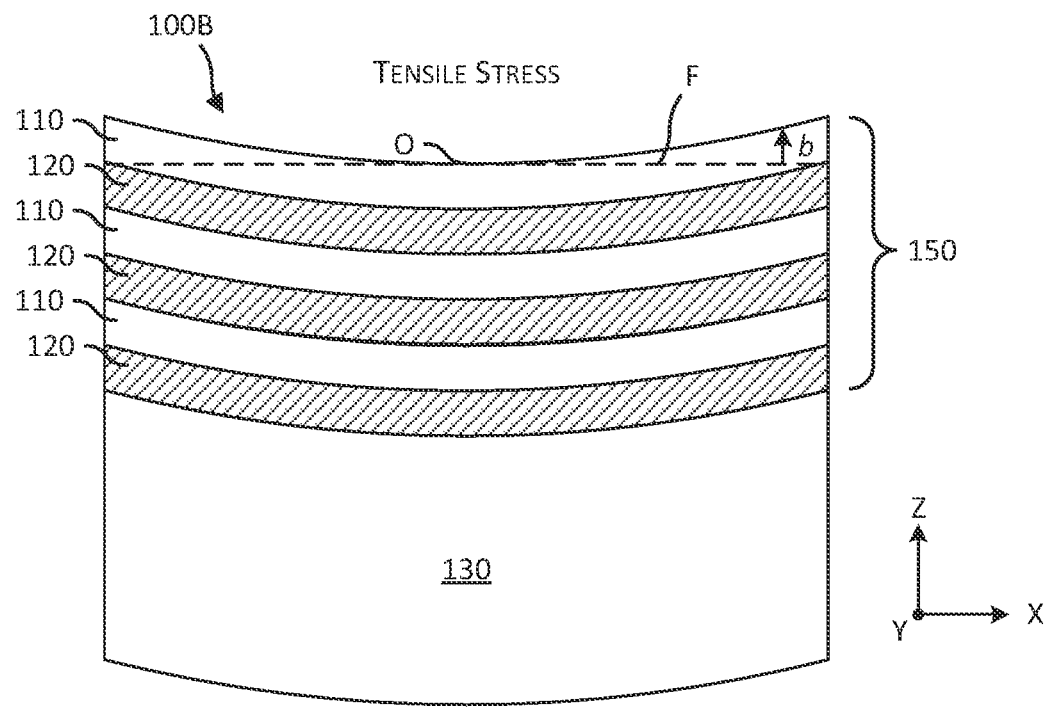

FIGS. 1A and 1B illustrate a cross-sectional view of bowing of two semiconductor wafers 100A and 100B. The wafers 100A and 100B include examples of a strained layer 150 that is a stacked layer formed over a semiconductor substrate 130. The stack includes a plurality of paired layers, where each pair is a first layer 120 of a first composition and a second layer no of a second composition. In FIG. 1A, the strained layer 150 is under compressive stress, causing the wafer 100A to bow downward, whereas the strained layer 150 in FIG. 1B is under tensile stress, causing the wafer 100B to bow upward. Surface deformation, such as bowing, may be defined to be a deviation of the deformed surface from a perfectly flat, but otherwise identical wafer. In FIGS. 1A and 1B, the selected flat reference wafer is the plane, F, indicated by a dashed line. The reference plane, F, is a horizontal plane (an X-Y plane in FIGS. 1A and 1B) passing through a center, O, of the top major surface of the semiconductor wafers 100A and 100B. The bow, b, across the top major surface of the wafers 100A and 100B may be measured as a vertical deviation (in the Z-direction) of the surface from F. Generally, b (indicated by an arrow) varies across the surface, or, $b=b(X, Y)$, where $(X, Y)$ is a location in the reference plane, F, with the origin $(0, 0)$ being O, the center of the deformed surface. By this definition, $b(0, 0)$ is zero micron. As seen in FIGS. 1A and 1B, bowing increases from the center to the edge.

In this disclosure, the invented methods for reducing wafer bow are described using the semiconductor wafer 100B in FIG. 1B as an example of a bowed wafer. In FIG. 1B, the strained layer 150 is a stacked layer having a concave surface because of tensile strain in the stack. It is noted that the same methods for bow compensation are applicable to wafer bow caused by compressive strain in the stack resulting in a convex surface, except the materials and processes may be modified to compensate an opposite type of strain.

For the sake of specificity, the strained layer 150 may be an example of a stack typically used in fabricating 3D NAND memory, where the layers alternate between the first layer 120 comprising silicon oxide, having a thickness of about 25 nm to about 40 nm, and the second layer no comprising silicon nitride, having a thickness similar to the first layer 120. The combined thickness of the strained layer 150 may be about 1 micron to about 10 microns.

Figure 2:
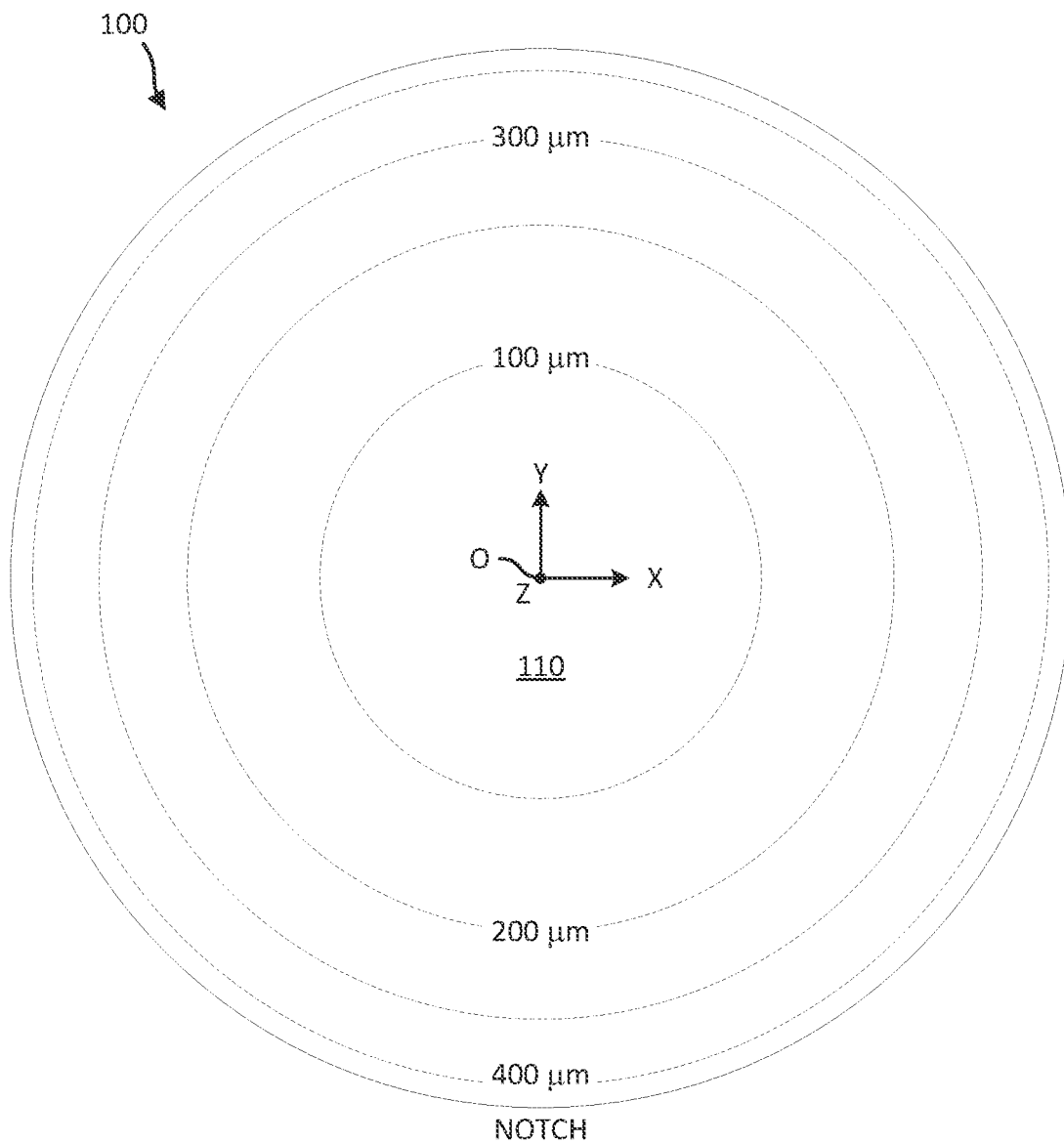
FIG. 2 illustrates a contour plot of wafer bow across a top major surface of the semiconductor wafer illustrated in FIG. 1B.

FIG. 2 illustrates a contour plot for one example of bow, b, across the top major surface of the bowed wafer 100B, illustrated in cross-sectional view in FIG. 1B. A rectangular (X, Y, Z) coordinate system is shown having its origin at the wafer center, O and the wafer notch located at the edge along the negative Y-axis. Results of theoretical calculations of the bow, b(X, Y), calculated using computer models to simulate the stress-induced deformation in the example bowed wafer 100B, are illustrated in FIG. 2. The stress simulations are performed for a 300 mm diameter silicon wafer, where the surface is covered with a uniformly deposited 6 microns thick strained layer 150 adhering to one side of 1 mm thick silicon substrate 130. The theoretical calculations of b(X, Y), performed using the assumptions mentioned above, show the magnitude of b is radially symmetric and increases from zero micron at the center, O, to about 400 microns at the edge.

Although example embodiments are described where the wafer deformation is radially symmetric to generate a bowed wafer with a concave top major surface, the methods are equally applicable to embodiments where the uncompensated stress generates a convex surface, as mentioned above. For wafers having the opposite curvature, trenches may be filled with an oppositely strained stress-compensation material. Persons skilled in the art may apply the inventive aspects of the invention to reduce wafer deformation in a more general case. In general, the spatial distribution of the surface deformation may be more complex, depending on the physical mechanism for strain and geometrical factors such as topography over which the strained layer 150 is formed. For example, the initial uncompensated bow may be having axial symmetry, the bow being predominantly in one direction (e.g., the X-direction). In some other example, the bow may be skewed toward one side of the top major surface of the wafer. In yet another example, the uncompensated deformation may be a warpage where the curvature of the surface is convex in one region and concave in another region.

Embodiments of this invention relate to semiconductor device fabrication methods that help reduce wafer bowing (e.g., the bow illustrated by the contour plot in FIG. 2) by compensating the stress in a bowed wafer, such as the bowed wafer 100B in FIG. 1B. As described in further detail below, the methods comprise embedding stress-compensation material filling a pattern of trenches formed in a top portion of the semiconductor wafer. A trench-fill layer comprising stress-compensation material inside the trenches may be formed to have a strain profile tailored to generate compensating stress that may reduce the stress in the initial bowed wafer. In the methods described in this disclosure, selection of the stress-compensation material, the deposition process, and the trench design collectively achieve the strain profile that effects compensating for the initial stress causing a severe wafer bow in the uncompensated wafer. The methods include a method for determining a pattern of trenches to achieve a reduction in wafer bow based on initial characterization relating the volume of stress-compensation material embedded in filled trenches to the respective reduction in wafer bow.

Figure 3:
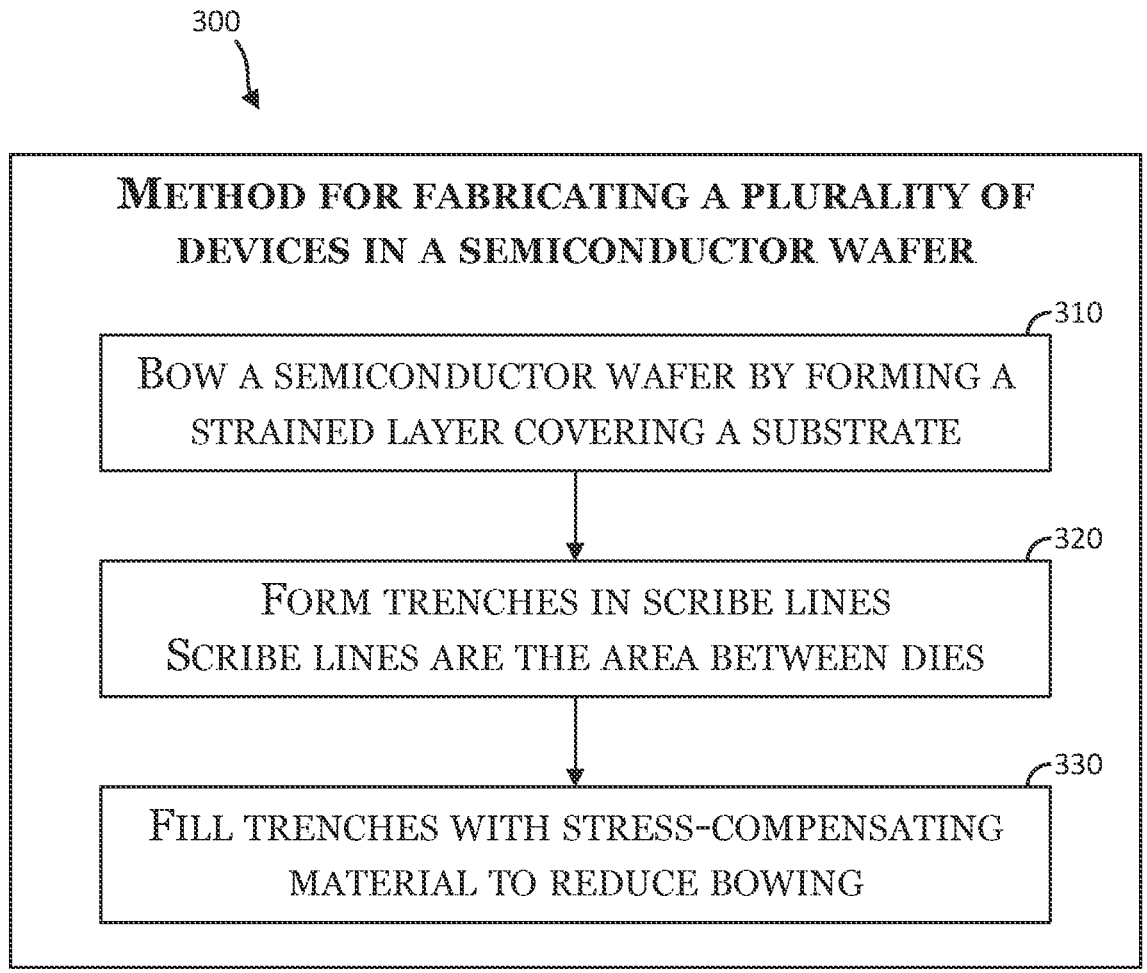
FIG. 3 illustrates a flow diagram for a method of fabricating a plurality of semiconductor devices in a semiconductor wafer, in accordance to some embodiment.

FIG. 3 illustrates a flow diagram of a method 300 for fabricating a plurality of semiconductor devices in a semiconductor wafer. In the example embodiments described in this disclosure, the semiconductor devices are integrated circuits (IC's). It is understood that the inventive aspects of the embodiments are applicable to other semiconductor devices, such as discrete transistors.

As indicated in box 310, at an intermediate stage of the fabrication process, a strained layer may be formed covering a surface of a substrate, such as the strained layer 150 covering the semiconductor substrate 130, illustrated in the cross-sectional view of the semiconductor wafer 100B in FIG. 1B. The strain in the deposited layer may bow the wafer, similar to the bow, b, illustrated by the contour plot in FIG. 2. In the example of bowing in FIG. 2, the magnitude of the wafer bow is greater than 400 microns, making it difficult, if not impossible, to pattern the strained layer to have features used in an advanced IC design, even with the state-of-the-art photolithography techniques. Hence, additional processing may have to be performed in the method 300 to reduce the bow prior to patterning the strained layer with a pattern designed to fabricate the IC's.

The additional processing to achieve adequate bow compensation comprises forming trenches in the bowed wafer and, subsequently, filling the trenches with a stress-compensation material, as indicated in boxes 320 and 330 in the flow diagram of method 300. It is noted that, as indicated in box 320, the trenches are formed at locations in scribe lines. The scribe lines are a sacrificial area of the wafer that may include structures used during wafer-level processing and testing but does not include any structure used in the IC product. One reason why the trench pattern is confined to the scribe lines is that this helps the method 300 provide a procedure for bow compensation that has low impact on the cost and complexity in manufacturing the IC's, as explained below with reference to FIGS. 3 and 4.

As known to persons skilled in the art, the process of fabricating IC's in a semiconductor wafer comprises repeatedly forming and patterning various layers with a sequence of patterns. Each pattern is etched on a photomask or reticle; all the photomasks for one IC design forms a reticle set. At each patterning level, the respective photomask is aligned to the wafer using alignment marks formed at a previous patterning level. The photomask pattern is then transferred to photoresist coated on the wafer surface. For example, a laser beam may illuminate a portion of the photomask pattern. An image of the resulting radiation pattern is projected onto the photoresist. The photomask and the wafer may be moved synchronously by a scanner such that an area of the wafer gets selectively exposed with an image of the photomask pattern. The exposure field is the designated IC area for a single IC. The scanner then steps the wafer stage and repeats the scan to expose photoresist in an adjacent IC area with the image. The step-and-repeat projects identical copies of the image of the photomask pattern across the wafer.

Figure 4:
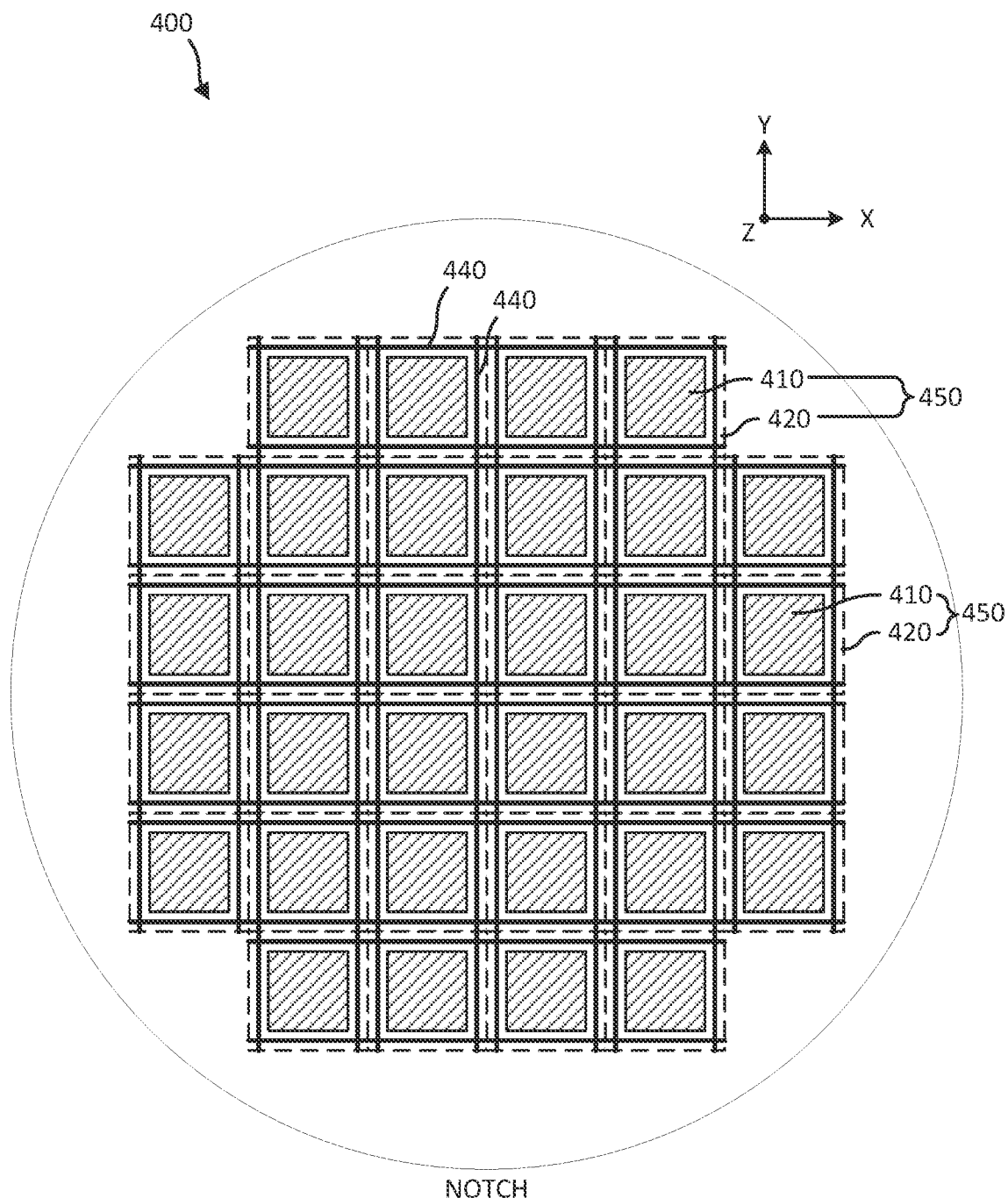
FIG. 4 illustrates a planar view of a semiconductor wafer, in accordance to some embodiment.

FIG. 4 is a schematic representation of a top view of a semiconductor wafer 400 in which a plurality of IC's may be fabricated using the method 300, described by the flow diagram in FIG. 3. A single IC is formed in a rectangular area of the wafer, identified as an IC area 450 and indicated by a dashed rectangular outline in FIG. 4. Each rectangular IC area 450 is partitioned into two areas: a central rectangular area identified as a die 410 and a scribe line 420 comprising four bands surrounding the die 410 on four sides up to the edges, which are indicated by the dashed lines. The circuitry for the final IC product is fabricated within the die 410 (the hatched rectangles in FIG. 4), and the scribe line 420 around each die is typically the area for placing sacrificial structures such as alignment marks and test structures for in-line wafer-level measurements used to monitor and control the fabrication process. Generally, each photomask pattern is printed on contiguous IC areas 450 by the step-and-repeat action of the scanner during the exposure step. In some embodiments, the scanner steps the wafer location to generate a two-dimensional (2D) array, similar to the arrangement of dies 410 and scribe lines 420, illustrated in FIG. 4. In some other embodiments, the scanner may print the photomask patterns over an area extending to the edge of the wafer 400, with partial patterns being printed close to the edge. Because of the rectangular geometry and contiguous placement of the IC areas 450, adjacent scribe lines 420 merge to form rows (lines along the X-direction) and columns (lines along the Y-direction) across the wafer that span all the area between adjacent dies 410. After the semiconductor wafer 400 has completed processing and wafer-level testing, the wafer may be scribed along the scribe lines 420 to singulate the wafer 400 into individual dies that may be packaged as units of the IC product.

In FIG. 4, the fabrication process is at a stage where the example semiconductor wafer 400 includes a strained layer over the semiconductor substrate; same as the O—N strained layer 150 over the silicon substrate 130 of the wafer 100B (see FIG. 1B). While the wafer 100B in FIG. 1B has a significant wafer bow generated by the unpatterned strained layer 150, wafer 400 in FIG. 4 has undergone additional processing in accordance with the fabrication method 300 (see FIG. 3) to reduce the wafer bow. As indicated in the flow diagram in FIG. 3, the strained layer 150 in wafer 400 has been patterned with a pattern of trenches in the scribe lines trenches (see box 320) and filled with the stress-compensation material (see box 330) forming filled trenches 440. The filled trenches 440 are represented schematically by dark lines in the scribe lines 420 in FIG. 4.

The additional processing for stress-compensation in the method 300 uses a dedicated photomask to form the filled trenches 440, thereby adding a photomask to the reticle set and a patterning level to the fabrication process flow. However, the cost increase is expected to be low for the following reasons.

The minimum feature sizes in the trench pattern may be relatively large for which the patterning cost is low. In various embodiments, the trench widths may be from about 1 micron to about 20 microns, and in some embodiments, up to 100 microns. The process control for the additional processing involved in forming the filled trenches 440 may be relaxed because there may be a larger tolerance for variations in feature size and trench profile since the structures for bow reduction are not part of the IC product.

The pattern of filled trenches 440 being in the scribe line 420, the addition of the filled trenches 440 in the wafer 400 does not affect the area of the die 410 or the IC product design. In some embodiments, where the filled trenches 440 do not extend into the substrate 130, the filled trenches 440 may be optionally removed during subsequent process steps used to pattern the strained layer 150 in the dies 410. In such embodiments, forming the filled trenches 440 does not increase either the area for the dies 410 or the area scribe lines 420. In other embodiments where at least a portion of the filled trenches 440 may not be removed, the area occupied by the filled trenches 440 may be shared with other structures which may be located in layers above the filled trenches 440.

Furthermore, in the method 300, the additional processing for bow compensation may be performed without having to place the front side of the wafer on a substrate holder of a processing apparatus. As known to a person skilled in the art, there is a penalty in increased cost and/or increased defect density and reduced yield for processes in which the front side is in contact with a substrate holder while, for example, a plasma deposition or a plasma etch process is performed on the back side. By reducing wafer bow with stress-compensation material in filled trenches 440 formed in a top portion of the wafer 400, the method 300 provides an advantage of higher yield.

Figure 5A:
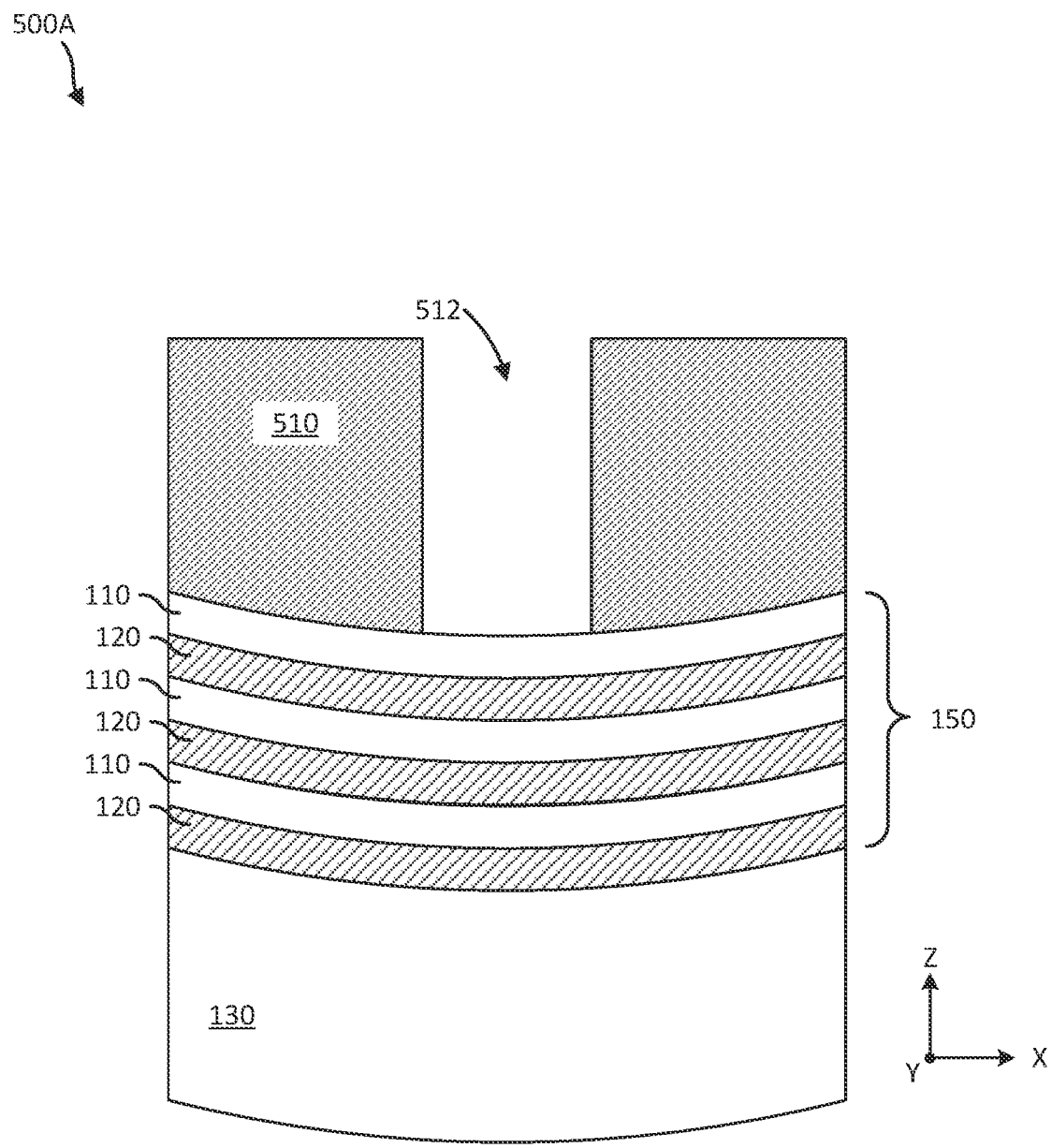
FIGS. 5A-5E illustrate cross-sectional views of a semiconductor wafer comprising a strained layer at various intermediate stages of a process flow for wafer bow reduction, in accordance to some embodiment.

The process flow for wafer bow reduction in the method 300 in FIG. 3 is described with reference to cross-sectional views of a wafer at various intermediate stages of processing illustrated in FIGS. 5A-5E. FIG. 5F illustrates a schematic plot of observations of wafer bow reduction seen in computer simulations of the process flow illustrated in FIGS. 5A-5E.

In the example embodiment of the invention illustrated in FIGS. 5A-5E, the incoming bowed wafer may be the bowed wafer 100B (see FIG. 1B) having the strained layer 150 covering the substrate 130. As mentioned above, the thickness of the strained layer 150 may be about 1 micron to about 10 microns. In the example embodiment, the strained layer 150 may be a stacked O—N layer (described above with reference to FIG. 1B) having a nominal thickness of about 6 microns. A thick dielectric stacked layer suitable for fabricating 3D NAND memory devices may have strain and exhibit mechanical stress over a wide range from compressive to tensile. Generally, the strain and resultant stress increases with the thickness of the stacked layer. The stress generated in the various layers of the semiconductor wafer depend on many additional factors, such as the materials, the deposition process used to form the stacked layer, and the processing history of the underlying layers in the substrate, The 6 microns thick O—N strained layer 150 in wafer 100B may be strained, for example, to have tensile stress of about 100 MPa to about 500 MPa, resulting in a wafer bow of about 200 microns to about 700 microns in a 300 mm diameter semiconductor wafer. Here, wafer bow refers to a maximum bow, $b=b_{max}$, occurring close to the edge of the bowed wafer 100B.

The method for bow reduction used in the example of embodiment of method 300 comprises patterning trenches in a top major surface of the bowed wafer 100B and filling the trenches with stress-compensating material. In the semiconductor wafer 500A in FIG. 5A, a patterned photoresist layer 510 is formed over the top major surface of the incoming wafer 100B using a photomask with a trench pattern designed for wafer bow reduction. The trench pattern may comprise long rectangles having a width from about 1 micron to about 100 microns. As explained above with reference to FIG. 4, the photomask for the trench pattern is designed to form trenches in the area designated for scribe lines. Accordingly, openings 512 in the photoresist layer 510 expose a portion of the top surface of the strained layer 150 in an area of the wafer 500A designated for the scribe lines.

Figure 5B:
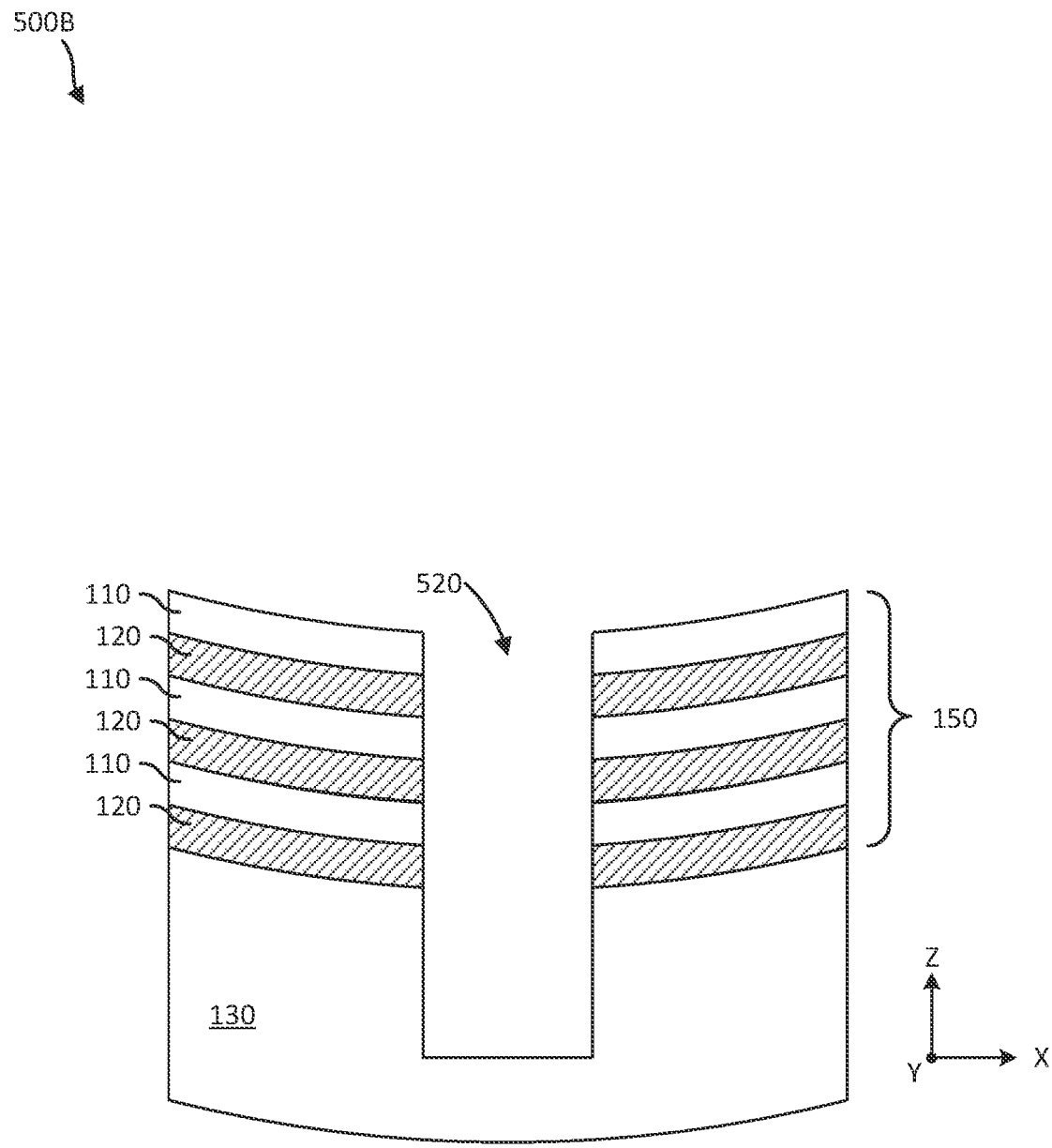

FIG. 5B illustrates the wafer 500B, where a trench 520 has been etched using the patterned photoresist layer 510 of wafer 500A as an etch mask. The etching may be performed using a suitable anisotropic etch technique, for example, a reactive ion etch (RIE) process using fluorine chemistry. In the example embodiment illustrated in FIG. 5B, a bottom of the trench 520 is located in the substrate 130 below the strained layer 150, at a depth exceeding the thickness of the strained layer 150. In some embodiments, the trench depth may be at least two times the thickness of the strained layer 150. In various embodiments, the bottom of trench 520 may be as deep as about 200 microns.

Although in the example illustrated in FIG. 5B, the trench 520 extends beyond the depth of the strained layer 150, in some other embodiment, the bottom of the trench may be within the strained layer 150 or at an exposed top surface of the substrate 130, so that the trench depth is less than or equal to the thickness of the strained layer 150, using a timed etch or an endpoint etch process, respectively.

Figure 5C:
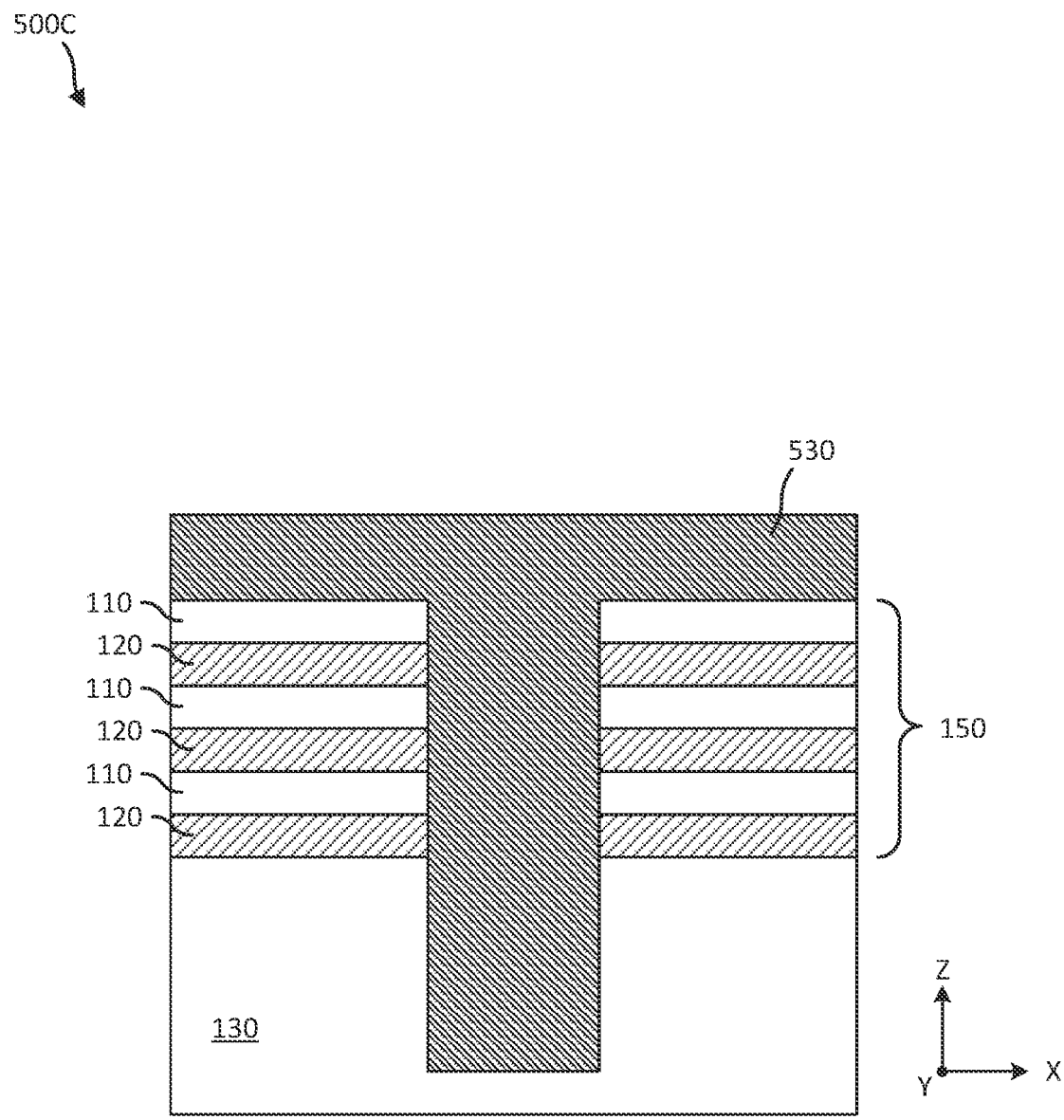

FIG. 5C illustrates wafer 500C after a trench-fill layer 530 comprising stress-compensation material is formed over the wafer 500B filling the trench 520. The trench 520 (in wafer 500B) has been overfilled with a stress-compensation material to a level substantially above the top surface of the wafer 500C. The stress-compensation material used to form the trench-fill layer 530 may comprise a material having an intrinsic compressive stress of about 100 MPa to about 1 GPa. For example, in one embodiment, the stress-compensating material may comprise polycrystalline silicon having an intrinsic stress of about 350 MPa. The stress-compensation material may be deposited using a suitable process such as chemical vapor deposition (CVD) or plasma-enhanced CVD.

In general, if a wafer is bowed concave by forming a strained layer, indicating tensile stress in the strained layer, then a stress-compensation material having an intrinsic compressive stress may be selected to form a trench-fill layer for bow compensation. Likewise, if a strained layer causes a convex bow, indicating compressive stress in the strained layer, then a stress-compensation material having an intrinsic tensile stress may be selected.

A large reduction in wafer bow may be achieved after the trenches 520 in wafer 500B are filled by the trench-fill layer 530 comprising a stress-compensation material in wafer 500C, as illustrated in FIG. 5C. It is noted that the wafer bow in wafer 500B (in FIG. 5B) is not significantly reduced in comparison with the bowed incoming wafer 100B (in FIG. 1B) and the wafer 500A (the wafer in FIG. 5A after forming a patterned photoresist layer 510). This indicates that forming the empty trenches 520 in the strained wafer 500B is inadequate for releasing the stress to achieve significant reduction in wafer bow. An appropriate selection of stress-compensation material and trench design may provide sufficient stress compensation to achieve a surface flat enough for printing the fine features used for fabricating semiconductor devices, such as 3D NAND memory.

In the example illustrated in FIG. 5C, the trench-fill layer 530 comprises a homogeneous stress compensation material. However, in some other embodiments, the trench-fill layer may comprise different stress-compensating materials at different depths in order to tailor the vertical stress profile in the semiconductor wafer 500C.

Figure 5D:
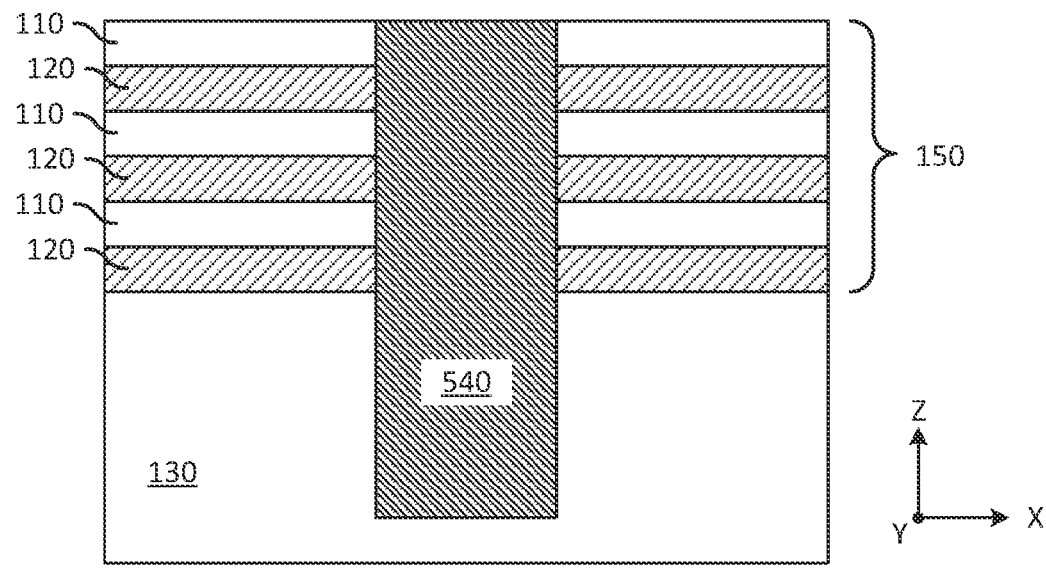

An excess portion of the trench-fill layer 530 overfilling the trenches 520 may be removed using a suitable etchback technique, for example, chemical mechanical planarization (CMP). FIG. 5D illustrates wafer 500D where the excess stress-compensation material over wafer 500C has been removed, exposing a top surface of the strained layer 150. In this example embodiment, the CMP etchback may be stopped using the top silicon nitride layer no of the strained layer 150. Removing the excess stress-compensation material and exposing a top surface of the strained layer 150 forms the filled trenches 540, as illustrated in FIG. 5D.

Figure 5E:
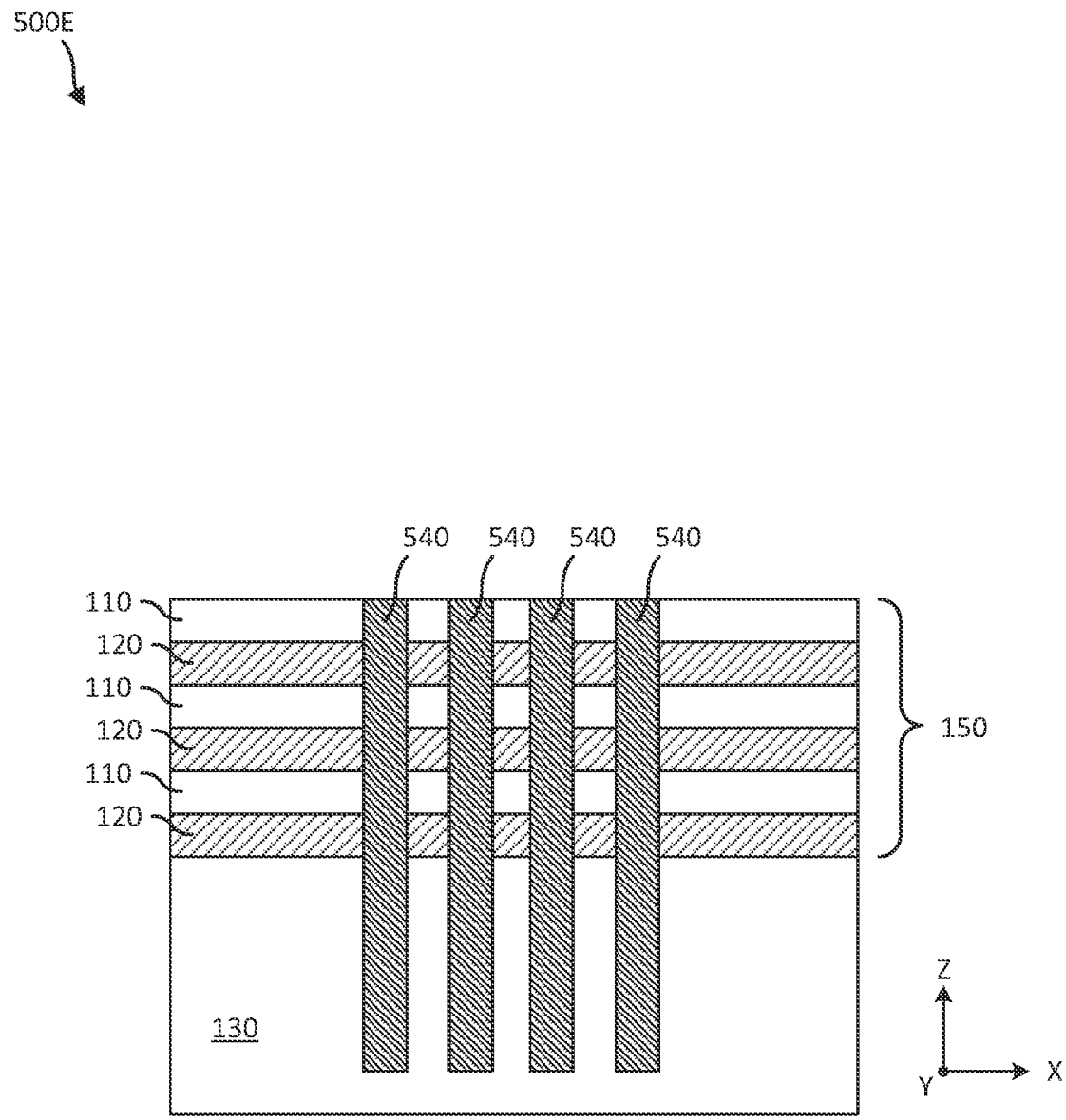
Figure 5F:
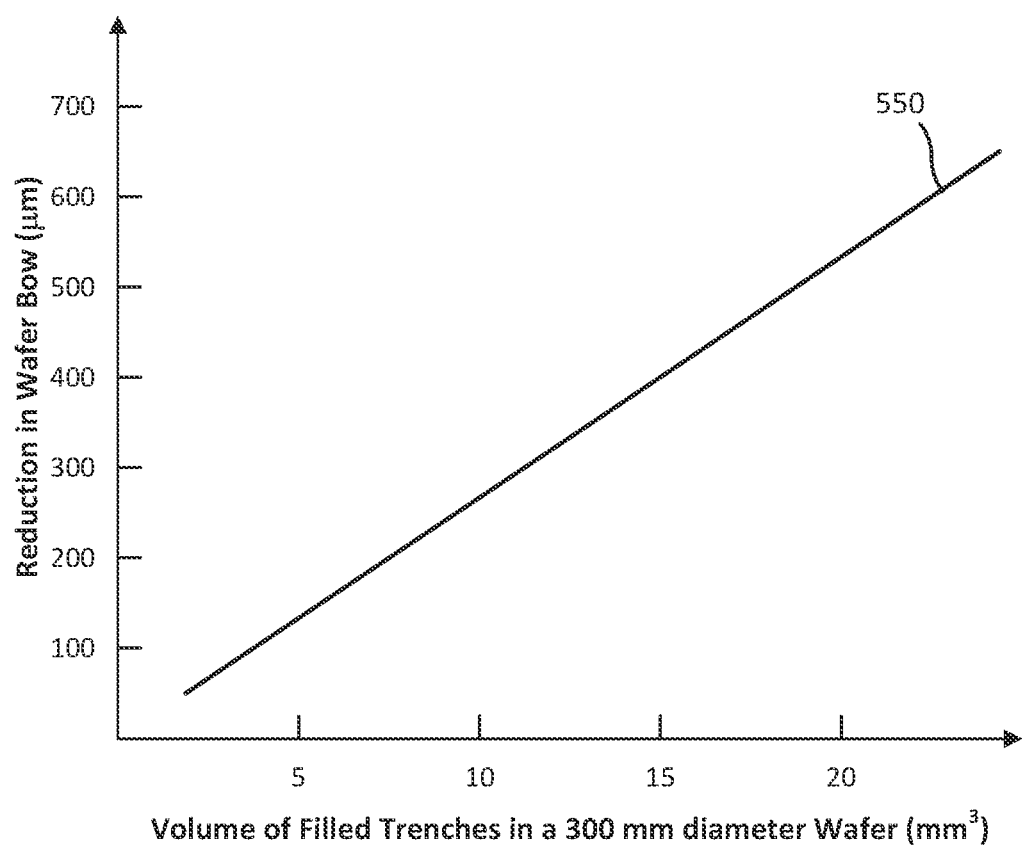
FIG. 5F illustrates a plot of a dependence of wafer bow reduction on the volume of filled trenches obtained from computer simulations of the process flow for wafer bow reduction, illustrated in FIGS. 5A-5E.

Performing the processing involved in forming the filled trenches 540 embedded in a semiconductor wafer is facilitated if the range of widths of the features in the trench pattern are not varied over a large range (e.g., from 1 micron to 100 microns). Restricting the width range in the design rules for the trench pattern (e.g., from 5 microns to 10 microns) may help reduce variation in trench depth during the etch process used to form the trenches 520. Also, during the deposition step forming the trench-fill layer 530, a narrow trench may get filled faster than a nearby wide trench. This causes local variations in the overfill thickness; the increase in surface topography making it more difficult for the CMP process to achieve high planarity for the final surface. In order to avoid such complications, a wide trench may be split into several narrower trenches. FIG. 5E illustrates an example where the wide filled trench 540 in wafer 500D (illustrated in FIG. 5D) has been replaced by four narrow filled trenches 540 in wafer 500E, providing the same total trench width.

For a specific combination of strained layer, substrate, and stress-compensation material, the bow reduction achieved by stress compensation depends on the trench geometry. The inventors have performed theoretical 3D simulations of wafer bow ($b_{max}$) and wafer bow reduction, where the trench depth is varied from 20 microns to 200 microns and the trench width is varied from 5 microns to 75 microns. The theoretical simulations are performed using calibrated computer models of mechanical stress and strain in the materials used in 300 mm diameter wafers where the semiconductor substrate comprises silicon. For example, in one simulation experiment the stress in the strained layer is about 100 MPa tensile and the stress in the stress compensating layer is about 500 MPa compressive. The strained layer used for the simulations is the same as that for the simulations described above with reference to FIG. 2 and similar to the example embodiment illustrated in FIGS. 5A-5E. The stress-compensation material is polycrystalline silicon. From an analysis of the simulation results, the inventors have determined that the reduction in wafer bow is roughly directly proportional to the volume of the filled trenches (filled with the stress-compensation material), irrespective of the trench depth and the trench width. This linear relationship is illustrated by a plot 550, illustrated in FIG. 5F. The plot 550 indicates that, for the strained layer and stress-compensation material used in the example embodiment described with reference to FIGS. 5A-5E, a wafer bow reduction of about 25 microns may be achieved for each cubic millimeter of filled trenches. Accordingly, in various embodiments, a volume of the stress-compensation material inside the trenches may be from about 1 mm$^3$ to about 20 mm$^3$.

A relationship between the reduction in wafer bow and the volume of filled trenches may be used in a method for designing a photomask to reduce bowing of a semiconductor wafer, as described in further detail below. For example, about 25 microns wafer bow reduction per cubic millimeter of filled trenches obtained from plot 550 in FIG. 5F may be used to calculate the area that may be allocated for trenches in the scribe lines of each IC.

The relationship may also be used in a feedforward process control system to adjust the etch process to adjust the depth of the trenches (e.g., trenches 520 in FIG. 5B) based on a measurement of the wafer bow generated after forming the strained layer (e.g., strained layer 150 of wafer 100B in FIG. 1B).

After the filled trenches 540 are formed, the fabrication flow may progress to the next patterning level, where the wafer 500D may be processed to pattern the strained layer 150 again using a different photomask designed to form finer features in the dies and scribe lines of the IC's, for example, the dies 410 and scribe lines 420 of the IC's 450 in the wafer 400 in FIG. 4.

Figure 6A:
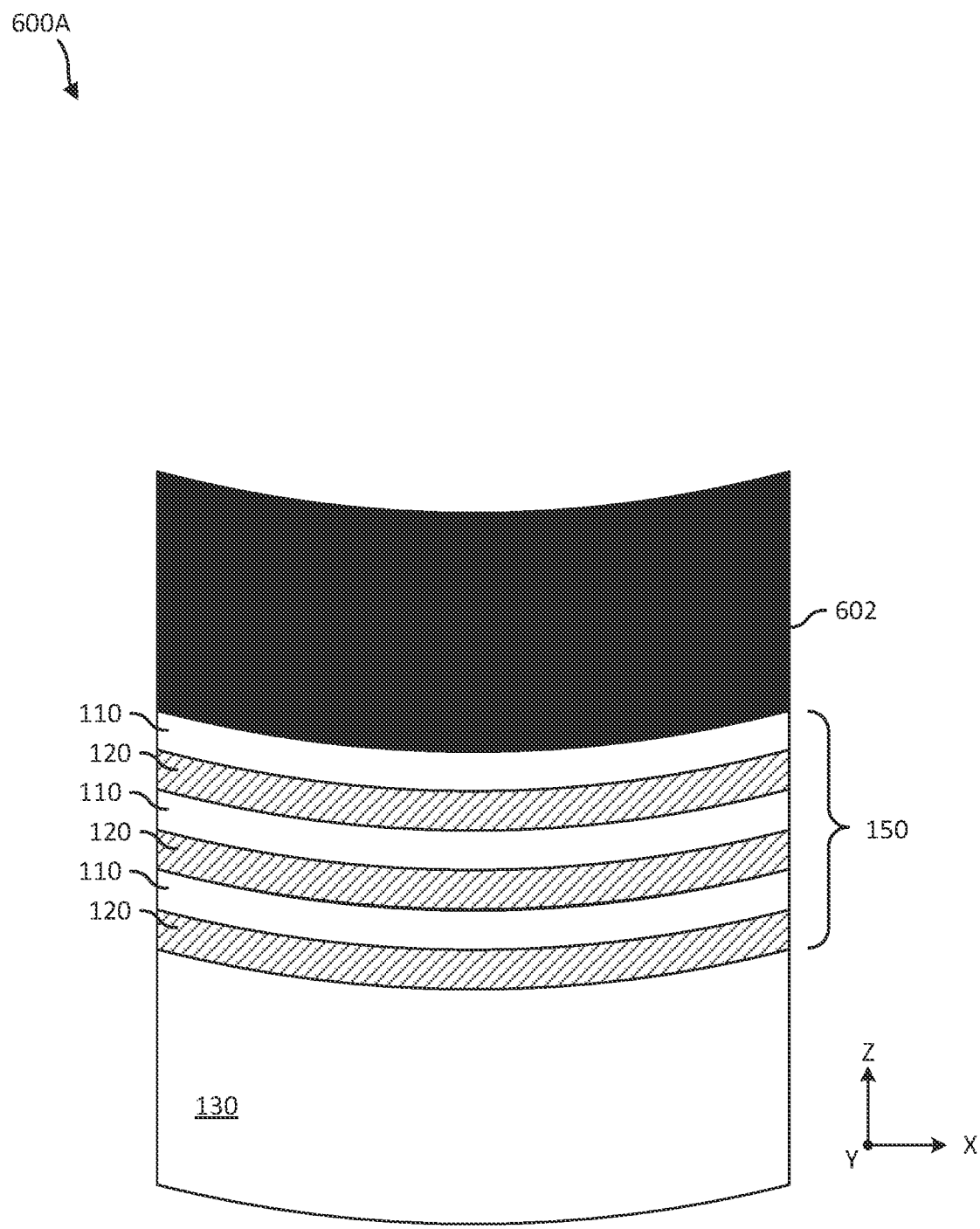
FIGS. 6A-6F illustrate cross-sectional views of a semiconductor wafer comprising a strained layer and a hard mask layer at various intermediate stages of a process flow, where stress-compensating material is embedded in trenches extending to a depth below the strained layer for wafer bow reduction, in accordance to some embodiment.

In another embodiment of the invention, the method for fabricating a plurality of semiconductor devices in a semiconductor wafer comprises bowing a semiconductor wafer comprising a substrate 130 by covering the substrate with a strained layer 150 and hard mask layer 602, such as wafer 600A illustrated in FIG. 6A. The strained layer 150 and the substrate 130 may be similar to the respective layers in wafer 100B illustrated in FIG. 1B. In various embodiments, the hard mask layer 602 may comprise, for example, amorphous carbon (a-C), titanium nitride (TiN), or silicon anti-reflective coating (SiARC), or the like, or a combination thereof. In one embodiment, the hard mask layer 602 comprises a stacked layer, where the stack comprises TiN/a-C/SiARC.

Figure 6B:
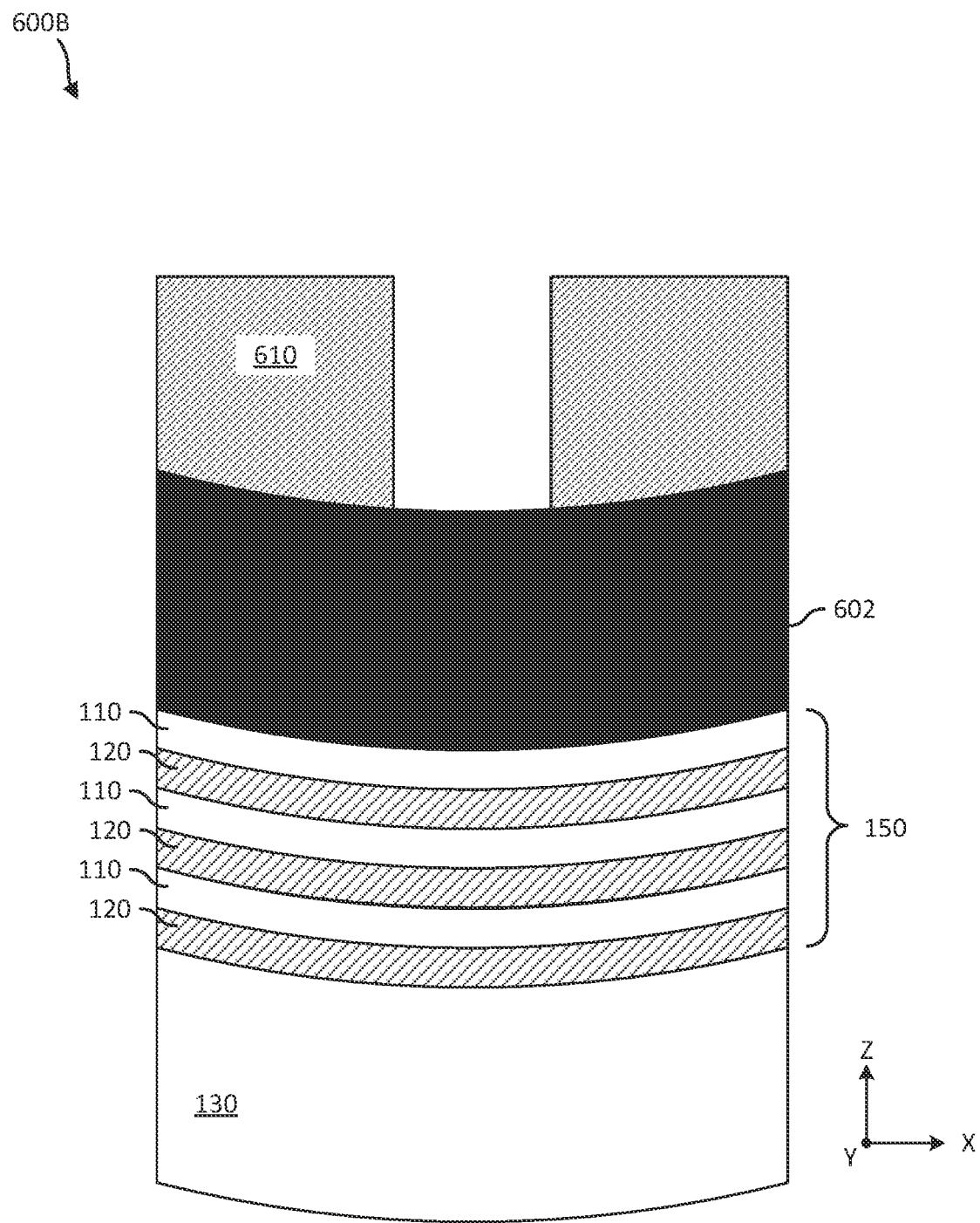

FIG. 6B illustrates the wafer 600B, where a patterned photoresist layer 610 is formed over the top major surface of the wafer 600A, similar to the wafer 500A described with reference to FIG. 5A.

Figure 6C:
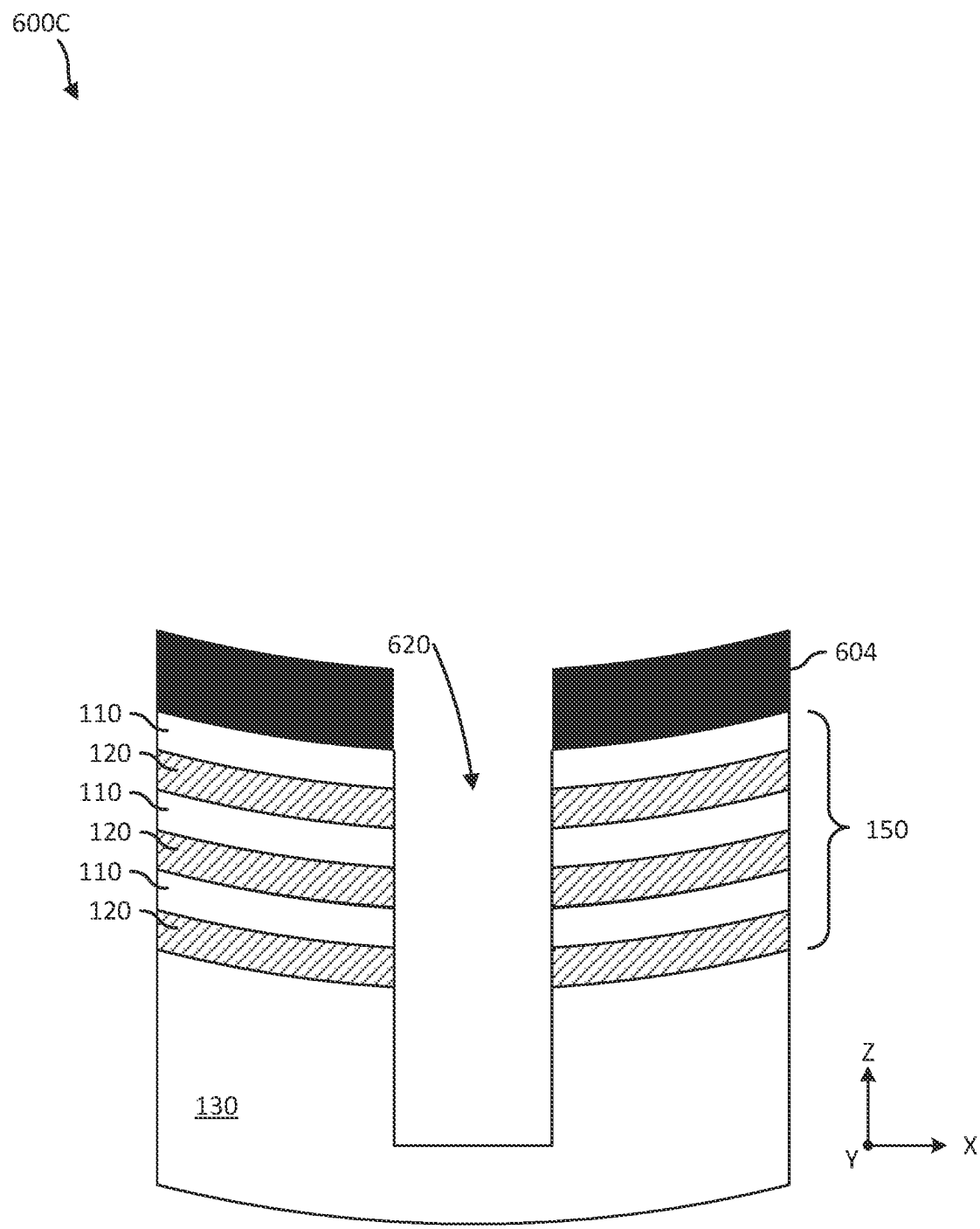

FIG. 6C illustrates the wafer 600C, where a trench 620 has been etched using the patterned photoresist layer 610 to etch the hard mask layer 602 of wafer 600B. The hard mask layer 602 of wafer 600B may be used as an etch mask to etch the strained layer 150 and a portion of the substrate 130 to form the trench 620. In various embodiments, the bottom of trench 620 may be as deep as about 200 microns. An anisotropic RIE technique may be used to selectively remove material from the O—N stack of the strained layer 150 and the silicon substrate 130, selective to the hard mask material (e.g., a stacked layer comprising TiN/a-C/SiARC). Although the removal rate for the hard mask material is relatively low, a substantial amount of hard mask material may be removed by the etch process to leave a relatively thin hard mask layer 604 remaining on the wafer 600C, as illustrated in FIG. 6C. The thickness of the initial hard mask layer 602 may be about 1 micron to about 5 microns, and the thickness remaining after the trench etch is complete may be about 20% to about 50% of the initial thickness.

In the example illustrated in FIG. 6C, the trench 620 extends beyond the depth of the strained layer 150. In some other embodiment, the trench etch may be terminated after the hard mask layer 602 is removed and a top layer of the strained layer 150 is exposed. In yet another embodiment, the bottom of the trench may be within the strained layer 150 or at an exposed top surface of the substrate 130, so that the trench depth is less than or equal to the thickness of the strained layer 150. Unlike the trench 620 in wafer 600C where the trench etch places the trench bottom deep into the substrate 130, in these embodiments, the trenches being relatively shallow, less material is removed and, furthermore, there is little or no reduction in the hard mask layer thickness. The embodiments with shallower trenches are described in further detail below with reference to FIGS. 7A-7B and FIG. 8.

Figure 6D:
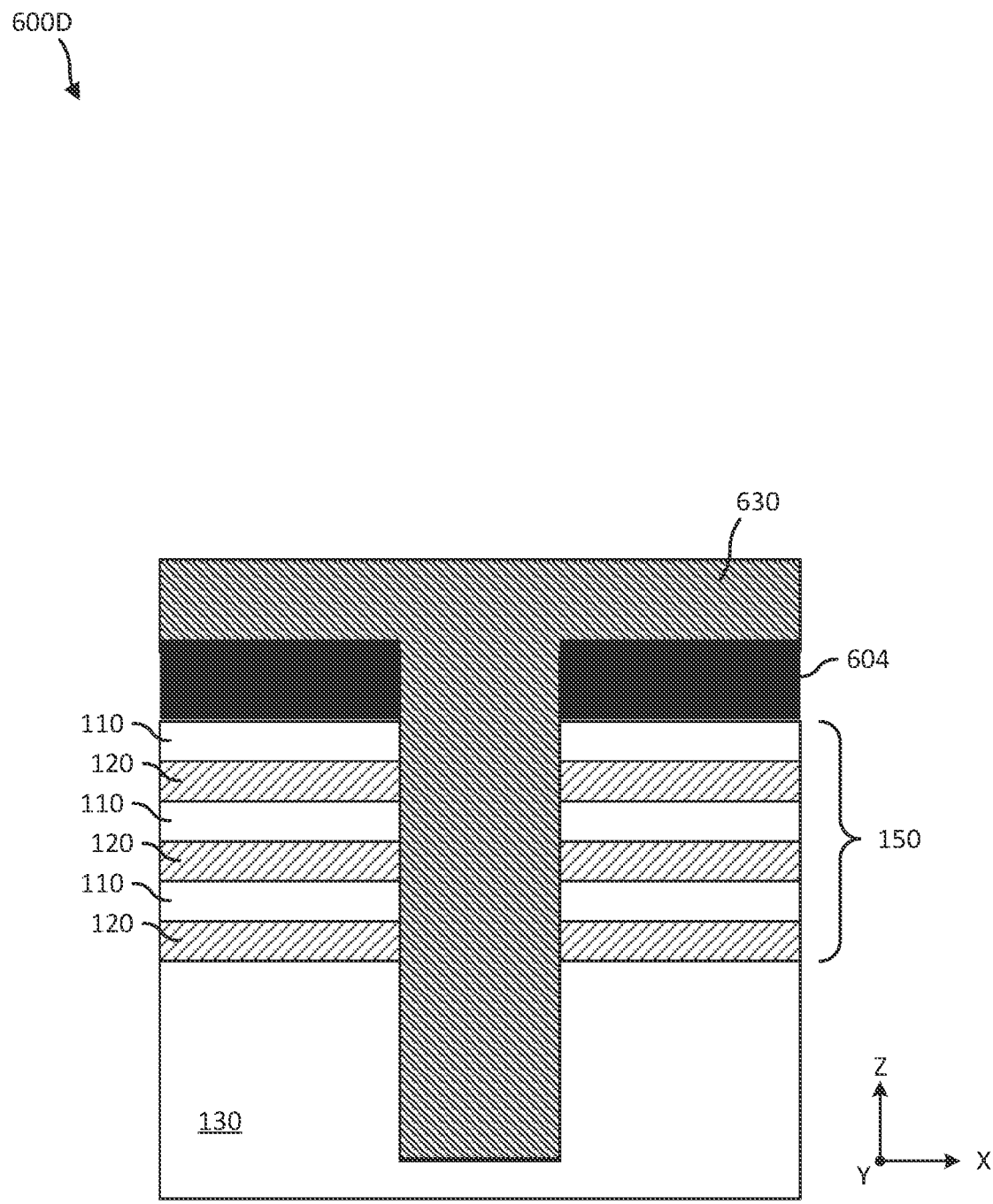

FIG. 6D illustrates wafer 600D after a trench-fill layer 630 comprising stress-compensation material is formed over the wafer 600C filling the trench 620. The deposition process and the stress-compensating material are similar to those described for wafer 500C with reference to FIG. 5C.

Similar to the example embodiment of the bow reduction method described with reference to FIGS. 5A-5E, forming the empty trenches 620 in the strained wafer 600C is inadequate for compensating the stress to achieve significant reduction in wafer bow. A large reduction in wafer bow may be achieved after the trenches 620 in wafer 600C are filled by the trench-fill layer 630 comprising stress compensation material in wafer 600D, as illustrated in FIG. 6D.

Figure 6E:
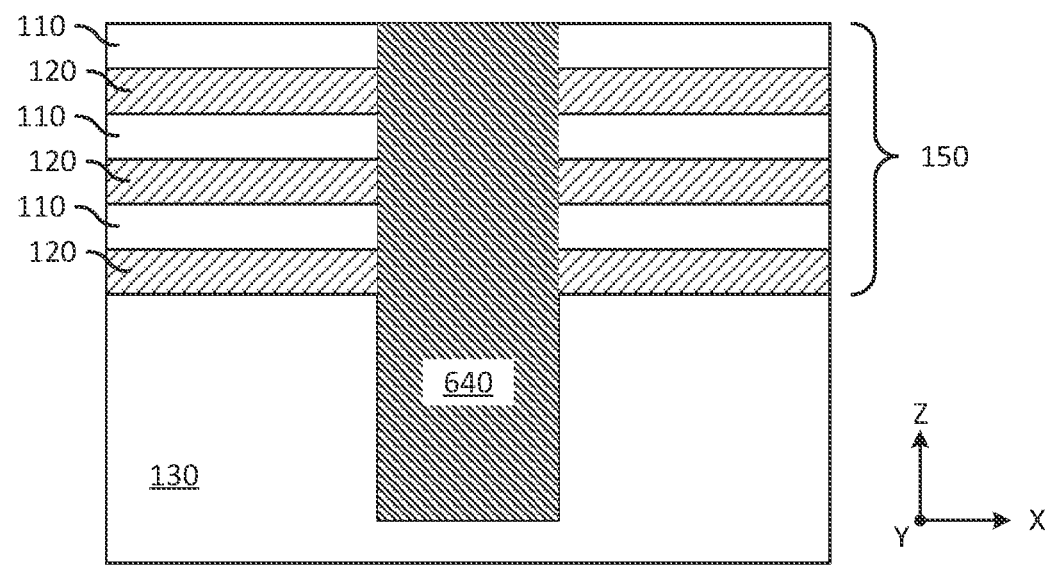

An excess portion of the trench-fill layer 630 overfilling the trenches 620 may be removed using a suitable etchback technique, for example, CMP. In this embodiment, the hard mask layer 604 remaining on the wafer 600C may be relatively thin; hence, inadequate to be reused as a hard mask for the next patterning level, in which the strained layer 150 is patterned again to form the IC product (e.g., the 3D NAND memory) and diagnostic test structures in the scribe lines. Since it would not be reused, the hard mask layer 604 may be removed from wafer 600D, exposing the top surface of the strained layer 150 to form the filled trenches 640 seen in a cross-sectional view of wafer 600E, illustrated in FIG. 6E.

The hard mask layer 604 may be removed along with the excess portion of the trench-fill layer 630 using, for example, a two-step CMP process comprising a first step removing the excess trench-fill layer 630 and stopping on the hard mask layer 604, and a second step removing the hard mask layer 604 and stopping on the top silicon nitride layer no of the strained layer 150.

It is noted that in the embodiment described above with reference to FIGS. 5A-5E, the state of the wafer after the CMP process is complete (wafer 500D in FIG. 5D) is similar to the state of the wafer after the two-step CMP process has removed the hard mask layer 604 (wafer 600E in FIG. 6E) in the embodiment described with reference to FIGS. 6A-6F.

Figure 6F:
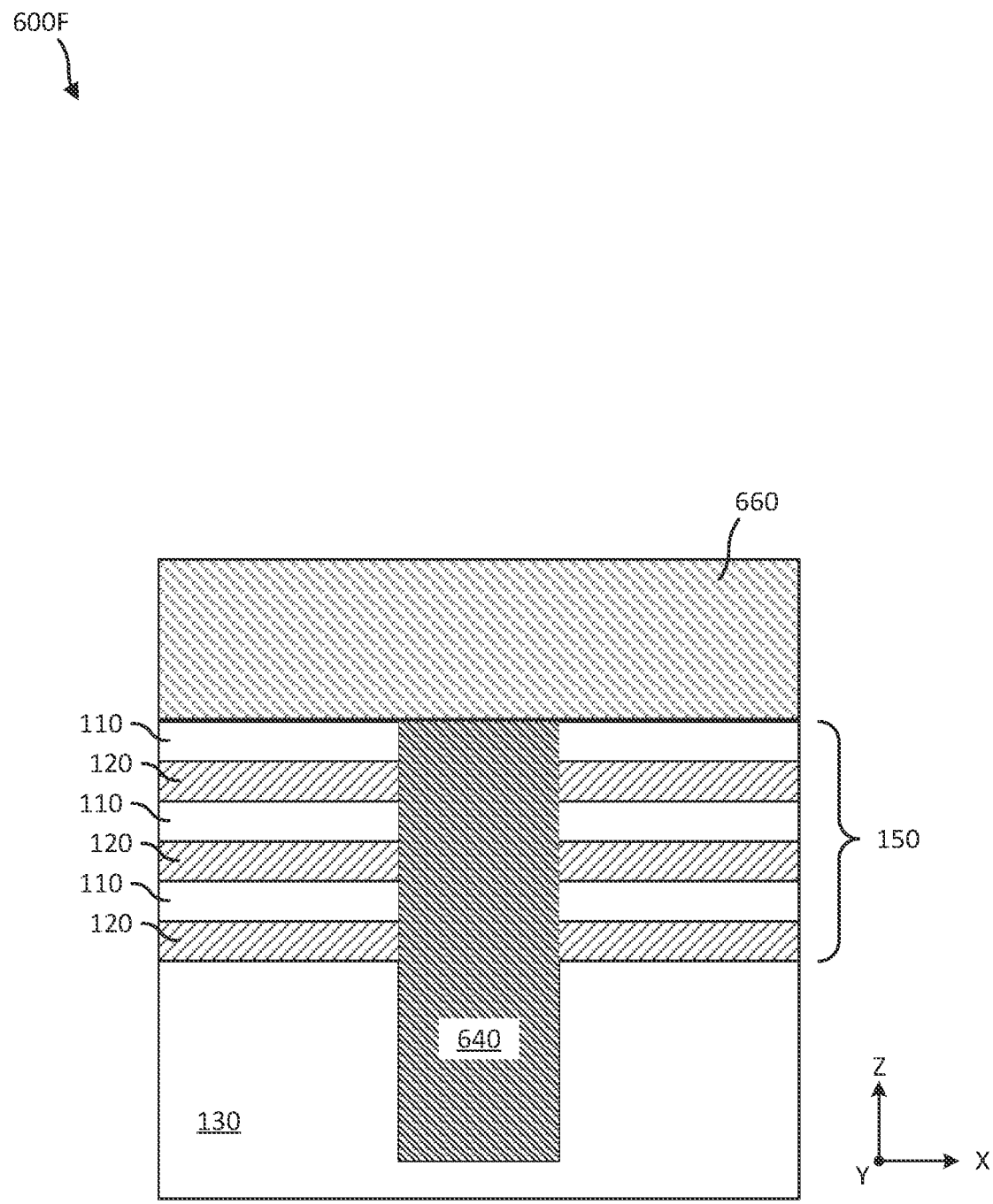

After removing the hard mask layer 604, a new hard mask layer 660 may be formed, as seen in the cross-sectional view of wafer 600F illustrated in FIG. 6F. The new hard mask layer 660 may comprise a material similar to the hard mask layer 602 of wafer 600A, described above with reference to FIG. 6A.

Figure 7A:
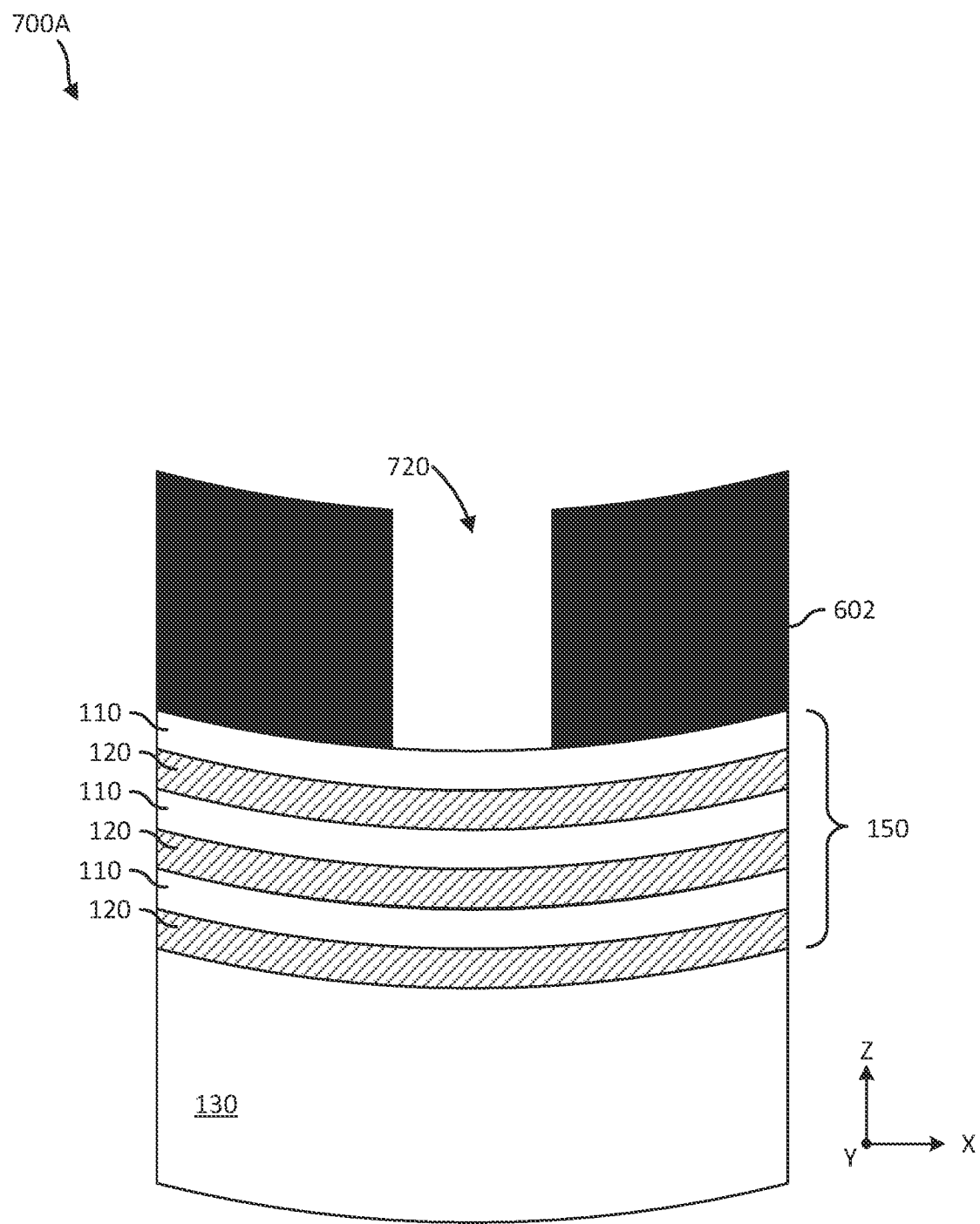
FIGS. 7A-7B illustrate cross-sectional views of a semiconductor wafer comprising a strained layer and a hard mask layer at various intermediate stages of a process flow, where stress-compensating material is embedded in trenches extending to a depth up to the top surface of the strained layer for wafer bow reduction, in accordance to some embodiment.

In another embodiment, described with reference to the cross-sectional views in FIGS. 7A and 7B, the trench depth may be the thickness of the hard mask layer 602. The patterned photoresist layer 610 (see FIG. 6B) may be used as the etch mask to form trenches 720 in the hard mask layer 602 using, for example, an anisotropic RIE process having an appropriate etch chemistry to selectively remove the hard mask layer 602, the etch stopping on the top silicon nitride layer no of the strained layer 150. FIG. 7A illustrates the relatively shallow trenches 720 formed in wafer 700A after the etching process is complete and the remaining photoresist has been stripped. Because the trench depth of the trenches 720 is substantially same as the thickness of the hard mask layer 602 (from about 1 micron to about 5 microns), the loss in hard mask material may be ignored. The hard mask layer 602 in wafer 700A may comprise, for example, a stacked layer comprising TiN/a-C/SiARC, and may be removed using an anisotropic RIE process.

Figure 7B:
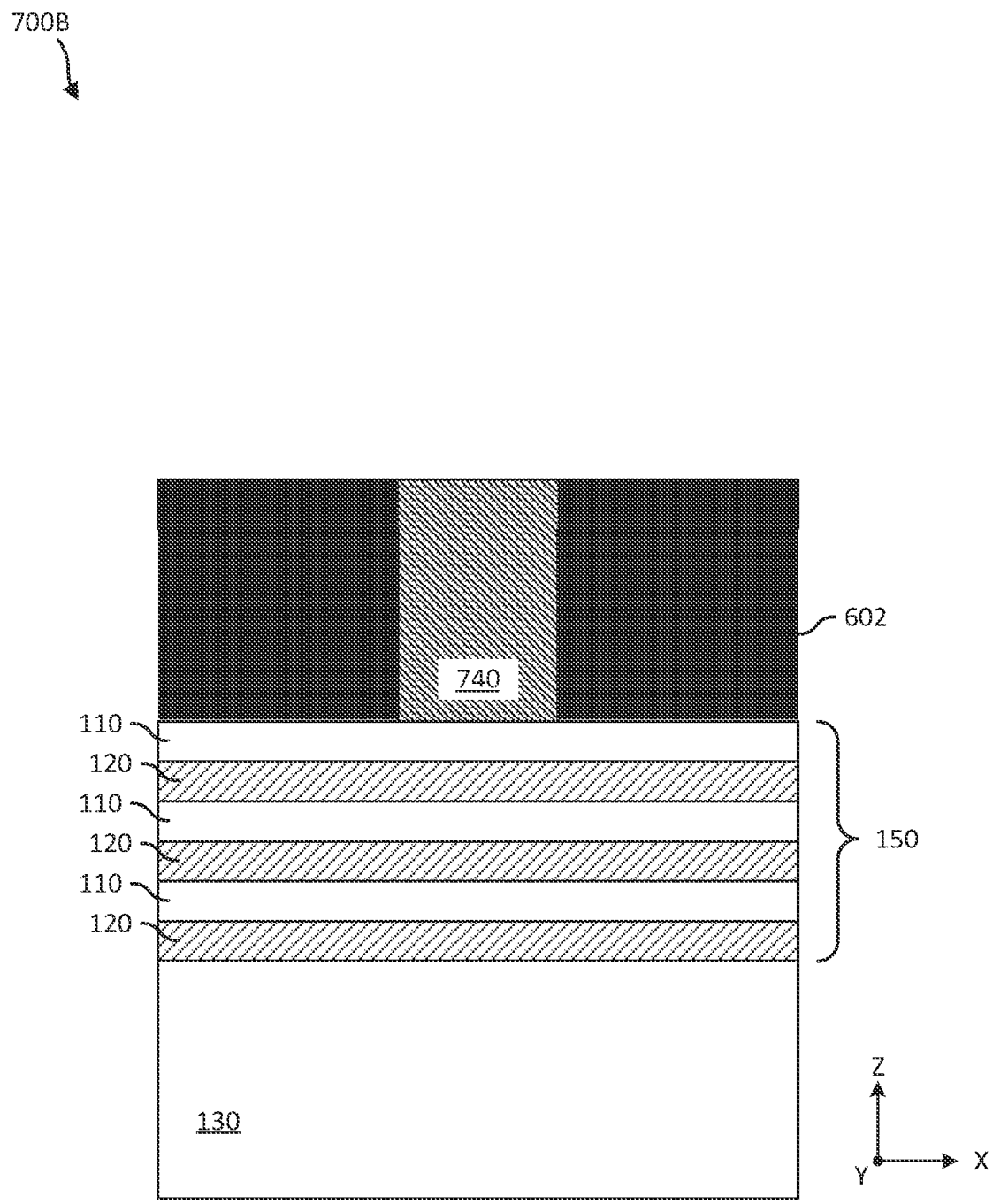

In FIG. 7B, the trenches 720 (illustrated in FIG. 7A) have been filled with a stress-compensation material, and an excess portion of the stress-compensation material has been removed from the top of the hard mask layer 602 to form the embedded filled trenches 740 in the wafer 700B. It is noted that, similar to the other embodiments described above, the wafer bow reduction is achieved primarily by filling the trenches with the stress-compensation material. Forming the empty trenches 720 may not be effective in reducing the bowing.

In yet another embodiment, the trenches have a depth that places the bottom wall below the hard mask layer 602 but does not extend the trenches below the strained layer 150 to a substantial depth in the substrate 130. Accordingly, the trenches in this embodiment are also relatively shallow, although the trenches are deeper in comparison to the trenches 720 in FIG. 7A. The trench etch process may be a suitable anisotropic RIE process. After the trench etch is complete, the trenches may be filled with the stress-compensation material, and excess stress-compensation material removed from over the surface by a CMP process, similar to the embodiment described above with reference to FIGS. 7A and 7B.

Figure 8:
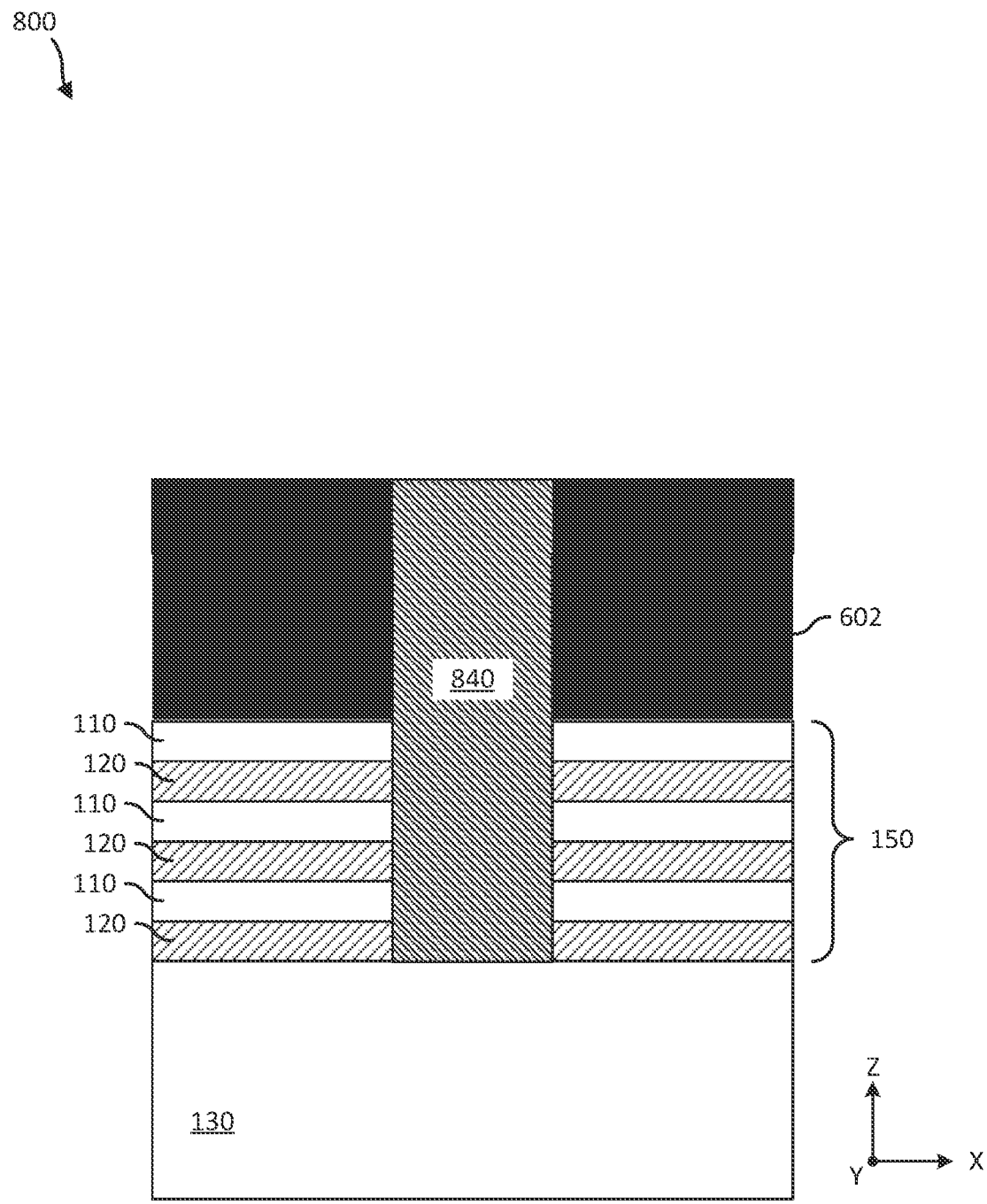
FIG. 8 illustrates a cross-sectional view of a semiconductor wafer comprising a strained layer and a hard mask at an intermediate stage of a process flow, where stress-compensating material is embedded in trenches extending to a depth below the hard mask layer up to the bottom of the strained layer for wafer bow reduction, in accordance to some embodiment.

FIG. 8 illustrates one example of the embodiment, where the trenches are extended below the hard mask layer 602 but not below the strained layer 150. The cross-sectional view of wafer Boo shows a filled trench 840 where the stress-compensation material is physically in contact with the substrate 130 at a depth substantially same as the interface between the strained layer 150 and the substrate 130. In the example illustrated in FIG. 8, an anisotropic RIE process has been performed to remove the hard mask layer 602 and the strained layer 150, stopping on a top surface of the substrate 130. In some other example, the anisotropic RIE step used to remove material from the O—N stack may be timed such that the trench bottom wall is placed above the top surface of the substrate 130.

The embodiments using the shallower filled trenches such as the filled trench 740 in FIG. 7B and the filled trench 840 in FIG. 8 may be more suitable for a fabrication process flow where the wafer bow caused by the strained layer 150 is not too severe because the wafer bow reduction decreases with reduced trench depth. However, as mentioned above, reduction in wafer bow increases with the volume of the stress-compensation material in the embedded filled trenches. Thus, a larger area of trenches may be used to offset the lower trench depth to provide a wafer bow reduction equivalent to that achieved with deeper trenches. In some embodiments, it may be possible to allocate the larger trench area because the shallower filled trenches (filled with the stress-compensation material) may be removed using processing steps performed during the patterning level used to pattern the strained layer 150 after reducing the wafer bow. For example, the filled trenches 740 (see FIG. 7B) may be removed by adjusting the etch processes used to strip the hard mask 602 after patterning the strained layer 150. The trenches 840 (see FIG. 8) may be, likewise, removed by modifying the photomask and the etch processes used for the patterning level for patterning the strained layer 150. The photomask may be modified to expose the locations of the trenches 840, and the etch processes used to etch the hard mask and the O—N stack of the strained layer 150 may be modified to remove the filled trenches 840.

Figure 9:
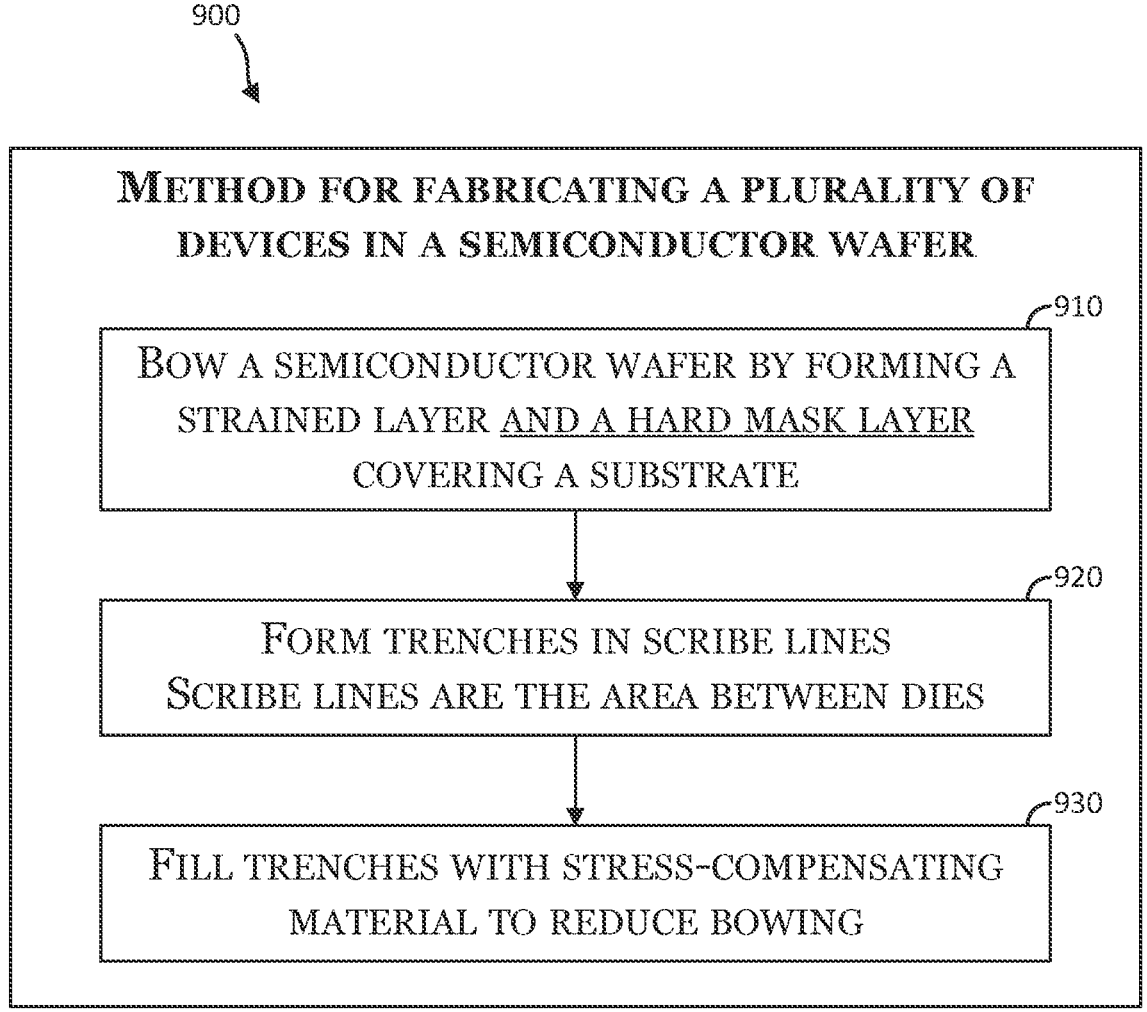
FIG. 9 illustrates a flow diagram for a method for reducing bowing of a semiconductor wafer, in accordance to some embodiment.

The examples of bow reduction process flows described above with reference to FIGS. 6A-6F, FIGS. 7A-7B, and FIG. 8 are various embodiments of a method 900 for fabrication of semiconductor devices incorporating processing for bow reduction in bowed wafers that comprise a substrate 130 covered with a strained layer 150 and hard mask layer 602 (e.g., wafer 600A in FIG. 6A). The method 900 may be succinctly described by a flow diagram illustrated in FIG. 9. As indicated in box 910 of the method 900, a semiconductor wafer is bowed by forming a strained layer and hard mask layer covering a substrate. In box 920, trenches are etched in the hard mask layer at locations in scribe lines of the semiconductor wafer. The bowing of the semiconductor wafer is reduced by filling the trenches with a stress-compensation material, as indicated in box 930 of the method 900.

Methods for fabricating semiconductor devices (e.g., IC's) are described above, in which the semiconductor wafers are bowed after forming a strained layer and the bowing is reduced using a stress compensation technique (e.g., method 300 (see FIG. 3) and 900 (see FIG. 9)). The stress compensation technique achieves a bow reduction using processing, including patterning trenches filled with stress-compensation material. The trenches are patterned using a predetermined trench pattern formed on a dedicated photomask. As mentioned above, a relationship between the reduction in wafer bow and the volume of filled trenches may be used in a method for designing the photomask to reduce bowing of a semiconductor wafer. An example method 950 for designing a photomask using such a relationship (e.g., the plot 550 in FIG. 5F) is described with reference to a flow diagram illustrated in FIG. 10.

Figure 10:
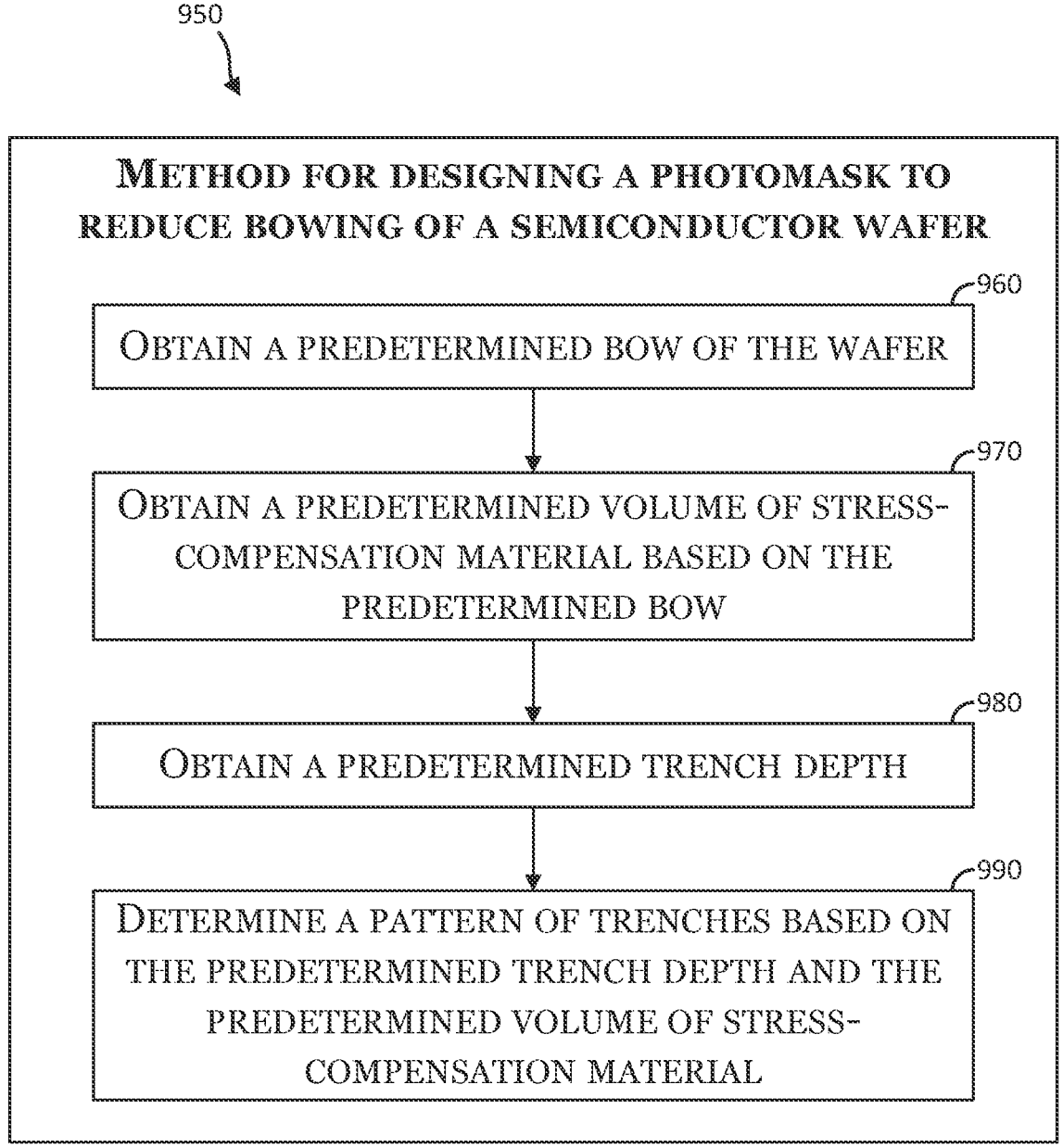
FIG. 10 illustrates a flow diagram for a method for designing a photomask to reduce bowing of a semiconductor wafer, in accordance to some embodiment.

As illustrated in box 960 in the flow diagram illustrated in FIG. 10, the method 950 obtains a predetermined magnitude of wafer bowing caused by depositing a strained layer covering a semiconductor substrate. The magnitude of bowing may be predetermined by measuring the bow generated in test wafers, where the test wafers are processed to have a strained layer formed on a substrate, similar to the wafers in which semiconductor devices are being fabricated. The bow generated in the test wafers may be measured using, for example, noncontact capacitive scanners.

In box 970 of the flow diagram illustrated in FIG. 10, a predetermined volume of stress-compensation material is obtained. The predetermined volume of stress-compensation material is the volume of filled trenches that may achieve a magnitude of bow reduction that would flatten the wafer such that the bow is reduced to a level that satisfies the flatness requirement for printing a pattern for the next patterning level. The dependence of reduction in wafer bow vs. volume of filled trenches (e.g., plot 550 in FIG. 5F) may be obtained by processing the bowed test wafers through the bow reduction process flow and measuring the wafer bow after the trenches have been patterned and filled to contain a known volume of stress-compensation material embedded in the wafer. The known volume of the filled trenches in a test wafer may be varied by adjusting the trench depth and by using different photomasks for different wafers, where each photomask has a different total trench area.

The trench depth may be constrained by processing capability, processing cost, and yield considerations. Various factors may be taken into account in selecting a target trench depth. Generally, it is more difficult and costly to etch and fill very deep trenches. In addition, as mentioned above, forming trenches that do not extend into the substrate provides the advantage that the trenches may be removed during subsequent processing, and the area reused to form other structures. For example, the filled trench 740 (illustrated in FIG. 7B) does not extend below the hard mask layer 602, which may be a sacrificial hard mask layer. The filled trench 740 may be removed along with the sacrificial hard mask layer 602. Hence, forming the filled trench 740 may not interfere with fabricating other structures in the same area. Likewise, as explained above, trenches 840 (illustrated in FIG. 8) may be removed by modifying the photomask and the etch processes used for the patterning level for patterning the strained layer 150. In such embodiments, the fabrication of other structures in the area of the filled trench 840 may not be affected, provided the structures do not include the strained layer 150. On the other hand, reducing trench depth reduces the ability to reduce wafer bow. In some embodiments, the wafer bow may not be reduced to an acceptable level unless deep trenches are formed and filled with an appropriate stress-compensation material. A trench depth may be selected based on the various considerations described above.

After the trench depth has been selected, the predetermined depth of the trenches may be obtained by method 950 to calculate a trench area based on the depth dimension and the predetermined volume of stress-compensation material in the filled trenches (box 970). As indicated in box 990, a trench pattern providing the calculated trench area may be determined.

The trench pattern designed using method 950 may be used to form the dedicated photomask, and the photomask used to pattern the semiconductor wafer to form the trenches filled with stress-compensation material to reduce bowing of a semiconductor wafer, as described above.

Figure 11A:
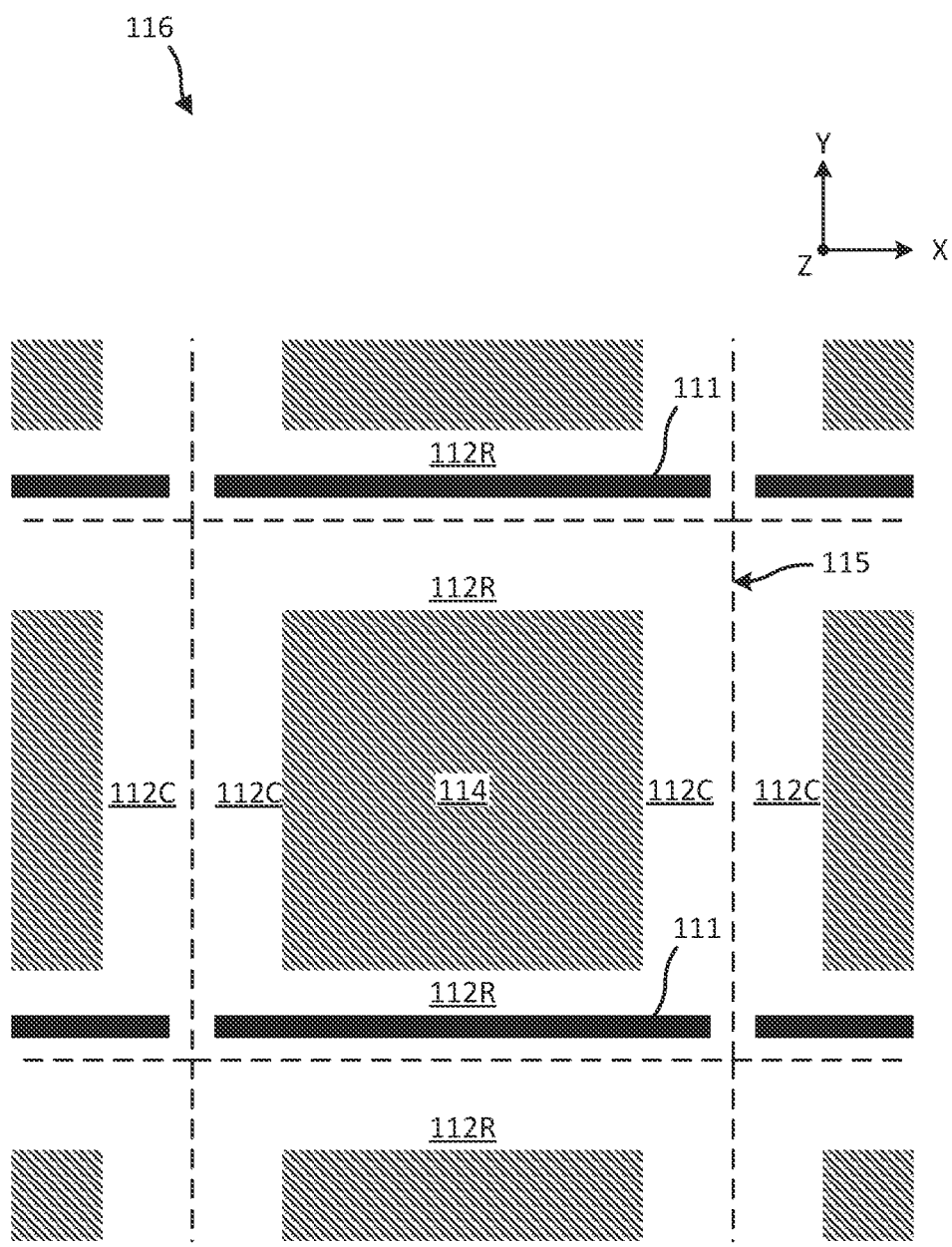
FIGS. 11A-11B illustrate planar views of a portion of two semiconductor wafers showing two different trench patterns, in accordance to some embodiments.
Figure 11B:
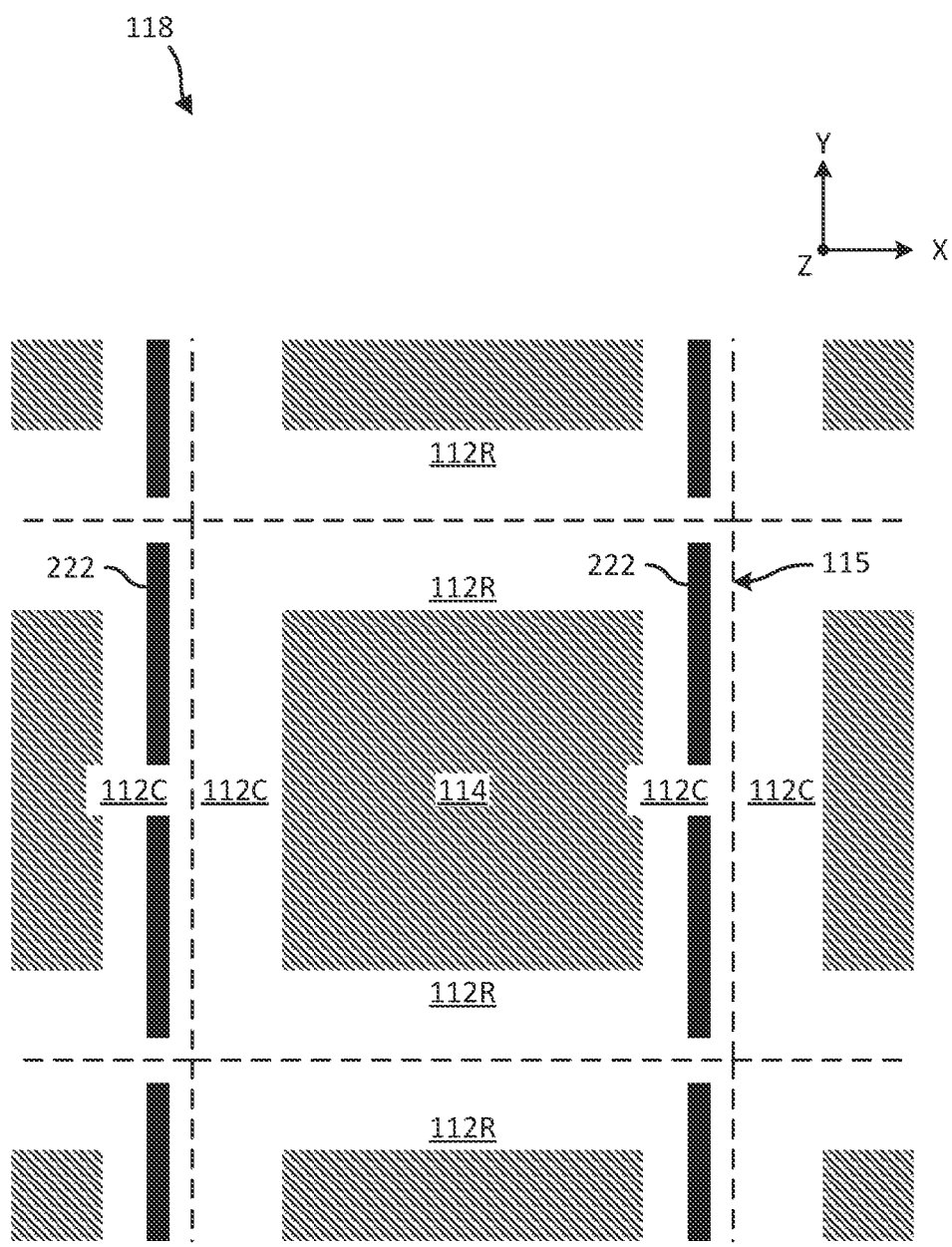

In various embodiments, a plurality of semiconductor devices may be fabricated on a semiconductor wafer, where the devices are IC's arranged in a 2D-array of contiguous rectangular IC areas, with each IC occupying one IC area. As explained above with reference to FIG. 4, each rectangular IC area is partitioned into two areas: a central rectangular area identified as a die and scribe lines comprising four bands surrounding the die on four sides up to the edges of the IC area. The trenches for bow reduction are placed in the scribe lines. In some embodiments, it is desirable to allocate a limited portion of the total area of the scribe lines for the trench pattern. Thus, the scribe lines may be split into a first set of regions comprising portions of the predetermined pattern of trenches and a second set of regions comprising no predetermined pattern of trenches. The second set of regions ensures that there would be sufficient area available for other structures to be placed in the scribe lines. Two example wafers 116 and 118, where the scribe lines have been split into regions having trenches and other regions without trenches are described with reference to planar views of a portion of the wafers 116 and 118, illustrated in FIGS. 11A and 11B. In FIGS. 11A and 11B, the boundaries of contiguous rectangular IC areas 115 are indicated by dashed lines. One whole IC area 115 and eight partial IC areas 115 are visible in the portion of the surface of the semiconductor wafers 116 and 118, illustrated in FIGS. 11A and 11B. Each IC area 115 comprises one die 114 and four scribe lines on four sides of the die 114. The four scribe lines in each IC area 115 are shown grouped as one pair of rows 112R and one pair of columns 112C.

The first set of regions in (the regions containing trenches) in the scribe lines of wafer 116 are indicated schematically by solid rectangles. In the example illustrated in FIG. 11A, the first set of regions 111 are confined to a first row 112R of each IC area 115. The other three scribe lines are included in the second set of regions, in which trenches may not be placed. FIG. 11B illustrates an example trench pattern having a different first set of regions 222 in the scribe lines of wafer 118. In the example illustrated in FIG. 11B, the first set of regions 222 are confined to a first row 112C of each IC area 115. Various trench patterns may be designed using the method 950, described above with reference to FIG. 10.

The inventive aspects of the embodiments described in this disclosure provide cost-effective methods for fabricating a plurality of semiconductor devices on a semiconductor wafer where the wafer is bowed by forming a strained layer on a substrate and the bow is reduced by forming filled trenches, filled with a stress-compensating material. A relationship between the bow reduction and the volume of the filled trenches, discovered by the inventors, is used to provide a method for designing the photomask based on a predetermined wafer bow, a predetermined volume of stress-compensation material, and a predetermined trench depth, predetermined by experimental test wafers and computer simulations of the fabrication process. The relationship between the bow reduction and the volume of the filled trenches may be further used in a feed forward process control system to adjust the trench depth by adjusting the respective etch process.

Example embodiments of the invention are summarized here. Other embodiments can also be understood from the entirety of the specification as well as the claims filed herein.

Example 1. A method for fabricating a plurality of semiconductor devices in a semiconductor wafer includes: bowing a semiconductor wafer including a substrate by covering the substrate with a strained layer; forming trenches at locations in scribe lines of the semiconductor wafer, the scribe lines identifying areas between adjacent dies on the semiconductor wafer; and reducing the bowing of the semiconductor wafer by filling the trenches with a stress-compensation material.

Example 2. The method of example 1, where the stress-compensation material includes polycrystalline silicon.

Example 3. The method of one of examples 1 or 2, where covering the substrate with the strained layer includes: depositing a stacked layer over the substrate, the stacked layer including a first layer of a first composition and a second layer of a second composition, the second composition being different from the first composition.

Example 4. The method of one of examples 1 to 3, where the first composition is an oxide and the second composition is a nitride.

Example 5. The method of one of examples 1 to 4, where forming the trenches includes: forming a plurality of trenches in each of the scribe lines.

Example 6. The method of one of examples 1 to 5, where the trenches extend through the strained layer into the substrate.

Example 7. The method of one of examples 1 to 6, where a volume of the stress-compensation material inside the trenches is from about 1 mm3 to about 20 mm3.

Example 8. A method for fabricating a plurality of semiconductor devices in a semiconductor wafer includes: bowing a semiconductor wafer including a substrate by covering the substrate with a strained layer and hard mask layer; forming trenches in the hard mask layer at locations in scribe lines of the semiconductor wafer, the scribe lines identifying areas between adjacent dies on the semiconductor wafer; and reducing the bowing of the semiconductor wafer by overfilling the trenches with a stress-compensation material and removing an excess portion of the stress-compensation material overfilling the trenches.

Example 9. The method of example 8, where forming trenches in the hard mask layer includes performing an etch process that selectively removes the hard mask layer, the etch process stopping on the strained layer.

Example 10. The method of one of examples 8 or 9, where forming trenches in the hard mask layer includes forming trenches extending through the hard mask layer into the strained layer, a bottom of the trenches being within the strained layer or at an exposed top surface of the substrate, the surface located at a depth substantially same as the depth of an interface between the strained layer and the substrate.

Example 11. The method of one of examples 8 to 10, where forming trenches in the hard mask layer includes forming trenches extending through the hard mask layer and the strained layer into the substrate.

Example 12. The method of one of examples 8 to 11, where overfilling the trenches with the stress-compensation material includes filling a first portion of the trenches with a first stress-compensation material and filling a second portion of the trenches with a second stress-compensation material, the first stress-compensation material being different from the second stress-compensation material.

Example 13. The method of one of examples 8 to 12, where removing an excess portion of the stress-compensation material includes removing the excess stress-compensation material selective to the hard mask layer.

Example 14. The method of one of examples 8 to 13, where removing an excess portion of the stress-compensation material overfilling the trenches includes removing the hard mask layer selective to the strained layer.

Example 15. A method for reducing bowing in a semiconductor wafer includes: designing a photomask, where designing the photomask includes: obtaining a predetermined bowing of a semiconductor wafer and based thereon obtaining a predetermined volume of a stress-compensation material; obtaining a predetermined depth of trenches to be formed in scribe lines of the semiconductor wafer; determining a pattern of trenches based on the predetermined depth of the trenches and the predetermined volume of the stress-compensation material, where the trenches are placed at locations in an area of the photomask for the scribe lines of the semiconductor wafer; forming a photomask with the determined pattern of trenches based on the designed photomask; processing a semiconductor wafer, the processing forming a strained layer covering a substrate, where the wafer is bowed after forming the strained layer; forming trenches at locations in the scribe lines using photolithography with the designed photomask, the trenches having a depth dimension; and filling the trenches with the stress-compensation material.

Example 16. The method of example 15, where the depth dimension is substantially same as the predetermined depth.

Example 17. The method of one of examples 15 or 16, where the depth dimension is obtained by a method including: measuring the bowing of the semiconductor wafer before forming the trenches; computing a volume of a stress-compensation material based on the predetermined volume of a stress-compensation material and a ratio of the measured bowing to the predetermined bowing of the semiconductor wafer; and computing a depth based on the predetermined pattern of trenches and the computed volume of a stress-compensation material.

Example 18. The method of one of examples 15 to 17, further includes forming trenches having a depth dimension at locations in the scribe lines on the semiconductor wafer using the designed photomask, where the scribe lines include a first set of regions including portions of the predetermined pattern of trenches and a second set of regions including no predetermined pattern of trenches, where each die is surrounded by one of the first set of regions and one of the second set of regions.

Example 19. The method of one of examples 15 to 18, further includes forming trenches having a depth dimension at locations in the scribe lines on the semiconductor wafer using the designed photomask, where the scribe lines include a plurality of pairs of rows, where each of the plurality of pairs of rows includes a first row including a pattern for trenches and a second row including no pattern for trenches.

Example 20. The method of one of examples 15 to 19, further includes forming trenches having a depth dimension at locations in the scribe lines on the semiconductor wafer using the designed photomask, where the scribe lines include a plurality of pairs of columns, where each of the plurality of pairs of columns includes a first column including a pattern for trenches and a second column including no pattern for trenches.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a plurality of semiconductor devices in a semiconductor wafer, the method comprising:
   bowing the semiconductor wafer comprising a substrate by covering the substrate with a strained layer;
   forming trenches through the strained layer into the substrate at locations in scribe lines of the semiconductor wafer, respective bottoms of the trenches being located in the substrate below the strained layer, the scribe lines identifying areas between adjacent dies on the semiconductor wafer; and
   reducing the bowing of the semiconductor wafer by filling the trenches with a stress-compensation material.

2. The method of claim 1, wherein the stress-compensation material comprises polycrystalline silicon.

3. The method of claim 1, wherein covering the substrate with the strained layer comprises:
   depositing a stacked layer over the substrate, the stacked layer comprising a first layer of a first composition and a second layer of a second composition, the second composition being different from the first composition.

4. The method of claim 3, wherein the first composition is an oxide and the second composition is a nitride.

5. The method of claim 1, wherein forming the trenches comprises:
   forming a plurality of trenches in each of the scribe lines.

6. The method of claim 1, wherein a volume of the stress-compensation material inside the trenches is from about 1 $mm^3$ to about 20 $mm^3$.

7. The method of claim 1, wherein the stress-compensating material has an intrinsic compressive stress in a range of 100 MPa to 1 GPa.

8. A method for fabricating a plurality of semiconductor devices in a semiconductor wafer, the method comprising:
   bowing a semiconductor wafer comprising a substrate by covering the substrate with a strained layer and hard mask layer;
   forming trenches in the hard mask layer at locations in scribe lines of the semiconductor wafer, the scribe lines identifying areas between adjacent dies on the semiconductor wafer; and
   reducing the bowing of the semiconductor wafer by overfilling the trenches with a stress-compensation material and removing an excess portion of the stress-compensation material overfilling the trenches, wherein removing the excess portion of the stress-compensation material overfilling the trenches includes removing the hard mask layer selective to the strained layer.

9. The method of claim 8, wherein forming the trenches in the hard mask layer comprises performing an etch process that selectively removes the hard mask layer, the etch process stopping on the strained layer.

10. The method of claim 8, wherein forming the trenches in the hard mask layer comprises forming the trenches extending through the hard mask layer into the strained layer, a bottom of the trenches being within the strained layer or at an exposed top surface of the substrate, the exposed top surface located at a depth substantially same as a depth of an interface between the strained layer and the substrate.

11. The method of claim 8, wherein forming the trenches in the hard mask layer comprises forming the trenches extending through the hard mask layer and the strained layer into the substrate.

12. The method of claim 8, wherein overfilling the trenches with the stress-compensation material comprises filling a first portion of the trenches with a first stress-compensation material and filling a second portion of the trenches with a second stress-compensation material, the first stress-compensation material being different from the second stress-compensation material.

13. The method of claim 8, wherein the hard mask layer comprises a stacked layer, the stacked layer comprising titanium nitride, amorphous carbon, and silicon anti-reflective coating.

14. The method of claim 8, wherein the strained layer comprises an oxide-nitride stack.

15. A method for reducing bowing in a semiconductor wafer, the method comprising:
designing a photomask, wherein designing the photomask comprises:
obtaining a predetermined bowing of a semiconductor wafer and based thereon obtaining a predetermined volume of a stress-compensation material;
obtaining a predetermined depth of trenches to be formed in scribe lines of the semiconductor wafer;
determining a pattern of trenches based on the predetermined depth of the trenches and the predetermined volume of the stress-compensation material, wherein the trenches are placed at locations in an area of the photomask for the scribe lines of the semiconductor wafer;
forming a photomask with the determined pattern of trenches based on the designed photomask;
processing a semiconductor wafer, the processing comprising forming a strained layer covering a substrate, wherein the wafer is bowed after forming the strained layer;
forming trenches at locations in the scribe lines using photolithography with the photomask with the determined pattern of trenches, the trenches having a depth dimension; and
filling the trenches with the stress-compensation material.

16. The method of claim 15, wherein the depth dimension is substantially same as the predetermined depth.

17. The method of claim 15, wherein the depth dimension is obtained by a method comprising:
measuring the bowing of the semiconductor wafer before forming the trenches;
computing a volume of the stress-compensation material based on the predetermined volume of the stress-compensation material and a ratio of the measured bowing to the predetermined bowing of the semiconductor wafer; and
computing a depth based on the predetermined pattern of trenches and the computed volume of the stress-compensation material.

18. The method of claim 15, further comprising forming the trenches having the depth dimension at locations in the scribe lines on the semiconductor wafer using the photomask with the determined pattern of trenches, wherein the scribe lines comprise a first set of regions comprising portions of the predetermined pattern of trenches and a second set of regions comprising no predetermined pattern of trenches, wherein each die is surrounded by one of the first set of regions and one of the second set of regions.

19. The method of claim 15, further comprising forming the trenches having the depth dimension at the locations in the scribe lines on the semiconductor wafer using the photomask with the determined pattern of trenches, wherein the scribe lines comprise a plurality of pairs of rows, wherein each of the plurality of pairs of rows comprises a first row comprising a pattern of the trenches and a second row comprising no pattern of the trenches.

20. The method of claim 15, further comprising forming the trenches having the depth dimension at the locations in the scribe lines on the semiconductor wafer using the photomask with the determined pattern of trenches, wherein the scribe lines comprise a plurality of pairs of columns, wherein each of the plurality of pairs of columns comprises a first column comprising a pattern of the trenches and a second column comprising no pattern of the trenches.

\* \* \* \* \*